US007466067B2

(12) United States Patent
Sugahara

(10) Patent No.: US 7,466,067 B2
(45) Date of Patent: Dec. 16, 2008

(54) PIEZOELECTRIC ACTUATOR, METHOD FOR PRODUCING PIEZOELECTRIC ACTUATOR, LIQUID TRANSPORTING APPARATUS, AND METHOD FOR PRODUCING LIQUID TRANSPORTING APPARATUS

(75) Inventor: Hiroto Sugahara, Aichi-ken (JP)

(73) Assignee: Brother Kogyo Kabushiki Kaisha, Nagoya-shi (JP)

( * ) Notice: Subject to any disclaimer, the term of this patent is extended or adjusted under 35 U.S.C. 154(b) by 0 days.

(21) Appl. No.: 11/264,397

(22) Filed: Nov. 1, 2005

(65) Prior Publication Data

US 2006/0132550 A1 Jun. 22, 2006

(30) Foreign Application Priority Data

Nov. 1, 2004 (JP) ............................ 2004-318337

(51) Int. Cl.
*H01L 41/047* (2006.01)
*B41J 2/045* (2006.01)

(52) U.S. Cl. ...................................... 310/365; 310/312

(58) Field of Classification Search ................. 310/328, 310/365, 366, 312, 320

See application file for complete search history.

(56) References Cited

U.S. PATENT DOCUMENTS 5,852,337 A * 12/1998 Takeuchi et al. ............ 310/328
6,347,862 B1 2/2002 Kanno et al.
6,863,383 B2 * 3/2005 Takahashi .................... 347/72
6,885,262 B2 * 4/2005 Nishimura et al. .......... 333/189
6,963,155 B1 * 11/2005 Wadaka et al. .............. 310/312
7,129,799 B2 * 10/2006 Sasaki ........................ 331/158
2001/0043029 A1 * 11/2001 Ladabaum .................. 310/334
2004/0246313 A1 * 12/2004 Lim et al. ..................... 347/68

FOREIGN PATENT DOCUMENTS

JP 10-286953 10/1998
JP 2003060252 2/2003
JP 2003-142750 5/2003

* cited by examiner

*Primary Examiner*—Jaydi A San Martin
*Assistant Examiner*—Derek J Rosenau
(74) *Attorney, Agent, or Firm*—Reed Smith LLP

(57) ABSTRACT

Thickness of a piezoelectric layer 31 is measured and widths of individual electrodes 32 are determined based on an amount of deviation of the measured thickness of the piezoelectric layer 31 from a predetermined reference thickness set in advance for the piezoelectric layer 31. Individual electrodes 32 of the determined widths are then formed on a side opposite to pressure chambers 14 of the piezoelectric layer 31. It is therefore possible to easily compensate for fluctuation in the thickness of the piezoelectric layer 31 with the widths of individual electrodes 32. As a result, it is possible to provide a piezoelectric actuator for liquid transporting apparatus, and a method for manufacturing a piezoelectric actuator or the like which is capable of compensating for the fluctuation in thickness of the piezoelectric layer with electrode width.

25 Claims, 14 Drawing Sheets

PIEZOELECTRIC ACTUATOR, METHOD FOR PRODUCING PIEZOELECTRIC ACTUATOR, LIQUID TRANSPORTING APPARATUS, AND METHOD FOR PRODUCING LIQUID TRANSPORTING APPARATUS

BACKGROUND OF THE INVENTION

1. Field of the Invention

The present invention relates to a piezoelectric actuator for a liquid transporting apparatus, a method for producing piezoelectric actuator, a liquid transporting apparatus and a method for producing liquid transporting apparatus.

2. Description of the Related Art

A liquid transporting apparatus such as an ink-jet head or the like for discharging ink from a nozzle is provided with an actuator for applying a pressure to a fluid so as to transport the fluid. Various configurations can be adopted for such actuators, but of these configurations, piezoelectric actuators in which a piezoelectric layer formed of a ferroelectric piezoelectric material such as lead zirconium titanate (PZT) is provided and deformation of the piezoelectric layer when an electric field is acting thereon are utilized to drive a subject are widely employed. For example, unimorph-type piezoelectric actuators used in ink-jet heads are typically provided with a vibration plate covering a pressure chamber accommodating ink, a piezoelectric layer arranged on a side of the vibration plate opposite to the pressure chamber, and two electrodes which are arranged on both sides of the piezoelectric layer respectively.

When a drive voltage is applied to one of the electrodes of this piezoelectric actuator, an electric field acts on the piezoelectric layer sandwiched between the two electrodes in a thickness direction and this portion of the piezoelectric layer extends in the thickness direction and contracts in a direction parallel to a plane of the piezoelectric layer. At this time, accompanying deformation of the piezoelectric layer, the vibration plate also deforms, due to which the volume of the pressure chamber changes, thereby applying pressure to ink in the pressure chamber.

The method for forming a piezoelectric layer includes, for example, an aerosol deposition method (AD method, for example, see Patent Document 1) in which extremely small particles of piezoelectric material are mixed with a carrier gas and blown against a substrate so as to collide the particles with the substrate at high speed so as to deposit the particles on the substrate, or a sputtering method (for example, see Patent Document 2) in which particles of a target are deposited on a substrate by ionizing argon or the like and causing the ionized argon to collide with the target.

[Patent Document 1] Japanese patent application laid-open No. 2003-142750.

[Patent Document 2] U.S. Pat. No. 6,347,862 and corresponding Japanese patent application laid-open No. 10-286953.

However, when particles of piezoelectric material are deposited on a vibration plate so as to form a piezoelectric layer using the AD method and sputtering method described above, there are cases in which the thickness of the piezoelectric layer deviates and fluctuates from a target value (design value). When thickness of a piezoelectric layer fluctuates within one piezoelectric actuator, the amount of deformation of the vibration plate is different for each of pressure chambers. There are therefore fluctuations in ink jetting characteristics such as droplet volume and droplet speed of the ink or the like which cause printing quality to deteriorate. Further, when fluctuation occurs in piezoelectric layers between a plurality of ink-jet heads, the thickness of the piezoelectric layer deviates from a predetermined range so that it is not possible to implement printing of the desired quality. In this case, yield rate falls.

SUMMARY OF THE INVENTION

It is therefore an object of the present invention to provide a piezoelectric actuator for a liquid transporting apparatus and a method of manufacturing a piezoelectric actuator capable of easily compensating for fluctuation in thickness of a piezoelectric layer.

According to a first aspect of the present invention, there is provided a piezoelectric actuator for a liquid transporting apparatus, which is provided on a surface of a channel unit having a plurality of pressure chambers arranged along a plane, and which selectively changes volumes of the plurality of pressure chambers; the piezoelectric actuator including: a vibration plate covering the plurality of pressure chambers; a piezoelectric layer arranged on a side of the vibration plate opposite to the pressure chambers; a first electrode provided at an area of the piezoelectric layer on a side of the pressure chambers, the area facing the pressure chambers; and second electrodes provided at areas of the piezoelectric layer on a side opposite to the pressure chambers, each of the areas facing the first electrode and one of the pressure chambers; wherein lengths in a predetermined direction of the second electrodes at portions facing the first electrode differ according to thicknesses of the piezoelectric layer at portions each of which is interposed between the first electrode and one of the second electrodes.

In the piezoelectric actuator of the present invention, the lengths in the predetermined direction of the second electrodes at the portions facing the first electrode may be adjusted according to an amount of deviation of thicknesses of the piezoelectric layer from a predetermined reference thickness at the portions each of which is interposed between the first electrode and one of the second electrodes.

According to the first aspect of the present invention, in the piezoelectric actuator of the present invention, when a drive voltage is applied to one of the first electrode and the second electrodes so that an electric field acts at the piezoelectric layer between the two electrodes, the piezoelectric layer and vibration plate deform and the volume of the pressure chamber changes, thereby applying pressure to liquid in the pressure chamber. Here, when the thickness of the piezoelectric layer fluctuates with respect to each of the pressure chambers, the amount of deformation of the vibration plate differs for each of the pressure chambers and characteristics therefore fluctuate while the liquid is transported. However, in the piezoelectric actuator of the present invention, even when there is fluctuation in the thickness of the piezoelectric layer, the lengths in a predetermined direction of the portions of the second electrodes, the portions facing the first electrode and generating an electric field in the piezoelectric layer, are determined to be an appropriate value according to the thicknesses of the piezoelectric layer, or more specifically, according to the amount of deviation of the thicknesses from a predetermined reference thickness. It is therefore possible to realize a piezoelectric actuator in which fluctuation in thickness of the piezoelectric layer is compensated for with the lengths in the predetermined direction of the second electrodes and in which fluctuation in the amount of deformation of the vibration plate is extremely small for each of the pressure chambers. Because of this, in the piezoelectric actuator of the present invention, lengths in the predetermined direction of the second electrodes differ depending on the thicknesses of the piezoelectric layer at the portions interposed between the first and second electrodes.

In the piezoelectric actuator of the present invention, the first electrode may be a common electrode formed continuously across the pressure chambers on a surface of the piezoelectric layer on a side of the pressure chambers; and the second electrodes may be individual electrodes to which a drive voltage is applied to deform the piezoelectric layer. In this case, by adjusting lengths in a predetermined direction of the individual electrodes to which drive voltage is applied, the fluctuation in thickness of the piezoelectric layer is compensated for.

In the piezoelectric actuator of the present invention, the vibration plate may be formed of a metal material and may function as the common electrode. When the vibration plate functions as the common electrode, it is not necessary to separately form a common electrode.

In the piezoelectric actuator of the present invention, each of the individual electrodes may be arranged at an area facing a central portion of one of the pressure chambers having a shape long in one direction, and may have a shape which is long in a longitudinal direction of one of the pressure chambers; and lengths in a short direction of the individual electrodes, parallel with the plane and orthogonal to the longitudinal direction, may be lengths determined according to the amount of deviation of the thicknesses of the piezoelectric layer. When the pressure chambers have a shape that is long in a predetermined direction, the length of each of the individual electrodes with respect to the short direction of one of the pressure chambers exerts a substantial influence on the deformation of the piezoelectric layer. Accordingly, the lengths in the short direction of the individual electrodes are determined according to the amount of deviation of the thicknesses of the piezoelectric layer.

In the piezoelectric actuator of the present invention, each of the individual electrodes may be arranged at least at an area overlapping with two edges of one of the pressure chambers, the two edges being positioned at both sides of one of the pressure chambers as viewed from a direction orthogonal to the plane with respect to a central line which passes through a center of one of the pressure chambers and which is parallel to the plane; and lengths of the individual electrodes in a direction which is parallel to the plane and orthogonal to the center line may be the lengths determined according to the amount of deviation of the thicknesses of the piezoelectric layer. In this way, when each of the individual electrodes is formed at an area overlapping with the two edges of one of the pressure chambers, the edges being positioned on both sides in relation to the center line of one of the pressure chambers, the lengths of the individual electrodes in the direction orthogonal to the center line are determined according to the amount of deviation of the thicknesses of the piezoelectric layer.

In the piezoelectric actuator of the present invention, surface areas of the individual electrodes facing the common electrode may all be equal in relation to the plurality of pressure chambers. When the lengths in the predetermined direction of the individual electrodes are set to different values among the pressure chambers to compensate for the fluctuation in the thickness of the piezoelectric layer, the surface areas of the plurality of individual electrodes become mutually different. In this case, electrostatic capacitance between each of the individual electrodes and the common electrode differs for every pressure chamber, and when drive voltages are then applied to the individual electrodes, there arises fluctuation in the timing at which pressure is actually applied to liquid in the pressure chambers. However, in the piezoelectric actuator of the present invention, fluctuation in electrostatic capacitance is small because the surface areas of the plurality of individual electrodes are equal, and it is possible to suppress the fluctuation in timing of the application of pressure in relation to the plurality of pressure chambers to a great extent.

In the piezoelectric actuator of the present invention, the individual electrodes may have extending sections each of which extends up to an area not facing one of the pressure chambers, and surface areas of the extending sections may be determined according to the lengths in the predetermined direction of the individual electrodes. Accordingly, it is possible to make the surface areas of the plurality of individual electrodes equal by setting the surface area of the extending section to an appropriate value according to the length in the predetermined direction of each of the individual electrodes.

In the piezoelectric actuator of the present invention, the first electrode may be individual electrodes to which a drive voltage is applied to deform the piezoelectric layer, and the second electrode may be formed on the side of the piezoelectric layer opposite to the pressure chambers to be a common electrode. In this case, a length in the predetermined direction of portions of the common electrode facing the individual electrodes respectively is adjusted to compensate for the fluctuation in the thickness of the piezoelectric layer.

In the piezoelectric actuator of the present invention, the second electrodes may be continuously formed to span across the plurality of pressure chambers. Accordingly, it is possible to keep the common electrode facing the plurality of pressure chambers at a common predetermined potential (for example, ground potential) via a small number of wirings and to simplify the structure of the actuator.

In the piezoelectric actuator of the present invention, a first electrode non-forming area, in which the common electrode is partially absent, may be provided at an area of the piezoelectric layer on a side opposite to the vibration plate, the area facing the individual electrodes. Accordingly, it is possible to make lengths in a predetermined direction of portions of the common electrode facing the individual electrodes respectively to be an appropriate length according to the amount of deviation of the thicknesses of the piezoelectric layer by appropriately setting the first electrode non-forming area in which the common electrode is not formed.

In the piezoelectric actuator of the present invention, wirings may be arranged in the piezoelectric layer on the side of the pressure chambers, the wirings being connected to the individual electrodes respectively to supply the drive voltage to the individual electrodes; and a second electrode non-forming area, in which the common electrode is partially absent, may be provided at an area of the piezoelectric layer on the side of the piezoelectric layer opposite to the pressure chambers, the area facing the wirings. Accordingly, it is possible to adjust the surface area of the second electrode non-forming area, which faces the wirings and in which the common electrode is not formed, to appropriately set surface areas of the portions of the common electrode facing the individual electrodes and the wirings respectively in such a manner that the fluctuation in electrostatic capacitance for each of the pressure chambers becomes small. In the piezoelectric actuator of the present invention, surface areas of portions of the common electrode facing the individual electrodes and the wirings respectively may be all equal in relation to the plurality of pressure chambers. In this case, the fluctuation in electrostatic capacitance in relation to the plurality of pressure chambers becomes small, and thus the fluctuation in timing of applying pressure to liquid in the pressure chamber can be kept very small.

In the piezoelectric actuator of the present invention, the common electrode may have at least one opening at an area facing one of the plurality of pressure chambers. Further, in the piezoelectric actuator of the present invention, surface areas of the areas in each of which the at least one opening and one of the individual electrodes overlap in a plane view may differ according to the thicknesses of the piezoelectric layer at portions each of which is interposed between one of the individual electrodes and the common electrode. In this way, by providing openings at the common electrode and adjusting the surface areas of the openings, it is possible to adjust the width of the portions in each of which one of the individual electrodes and the common electrode overlap in a plane view.

According to a second aspect of the present invention, there is provided a method for manufacturing a piezoelectric actuator for a liquid transporting apparatus, the piezoelectric actuator being provided on a surface of a channel unit having a plurality of pressure chambers arranged along a plane, and selectively changing volumes of the plurality of pressure chambers, the method including: a piezoelectric layer forming step of forming a piezoelectric layer on a surface of a vibration plate which covers the pressure chambers and which has a first electrode, the piezoelectric layer being formed on the surface of the vibration plate on a side of the first electrode, the first electrode being provided at an area of the vibration plate which faces the pressure chambers and which is on a surface of the vibration plate opposite to the pressure chambers; a thickness measuring step of measuring thicknesses of the piezoelectric layer at areas of the piezoelectric layer, each of the areas overlapping with one of the pressure chambers and the first electrode in a plane view; and a step of forming second electrodes on a surface of the piezoelectric layer on a side opposite to the first electrode while adjusting lengths in a predetermined direction of the second electrodes according to the measured thicknesses of the piezoelectric layer.

In the method for manufacturing the piezoelectric actuator of the present invention, the step of forming the second electrodes may further include: an electrode length determining step of determining lengths in the predetermined direction of portions of the second electrodes facing the first electrode, each of the second electrodes facing the first electrode at least partially with the piezoelectric layer being interposed between the first and second electrodes, the lengths being determined according to the thicknesses of the piezoelectric layer measured in the thickness measuring step, or more specifically, an amount of deviation of the thicknesses of the piezoelectric layer measured in the thickness measuring step from a predetermined reference thickness set in advance; and an electrode forming step for forming the second electrodes, on the side of the piezoelectric layer opposite to the pressure chambers such that the lengths in the predetermined direction of the portions of the second electrodes facing the first electrode become the lengths determined in the electrode length determining step.

Therefore, even when the thickness of the piezoelectric layer fluctuates in relation to the plurality of pressure chambers, in the electrode length determining step, the fluctuation in the thickness of the piezoelectric layer is compensated for by determining the lengths of the second electrodes in the predetermined direction according to the thicknesses of the piezoelectric layer, and particularly according to the amount of deviation of the thicknesses of the piezoelectric layer from the predetermined references thickness, thereby making it possible to make fluctuation in the amount of deformation of the vibration plate to be small. The present invention is not limited to fluctuation in a piezoelectric layer between a plurality of pressure chambers in a single piezoelectric actuator, and is also applicable to compensation of fluctuation of piezoelectric layers between a plurality of piezoelectric actuators.

In the method for manufacturing the piezoelectric actuator of the present invention, the piezoelectric layer may be formed, in the piezoelectric layer forming step, by an aerosol deposition method, a sputtering method, a chemical vapor deposition method, a sol-gel method, or a hydrothermal synthesis method. By using these methods, it is possible to form an extremely thin piezoelectric layer in a comparatively easy manner.

In the method for manufacturing the piezoelectric actuator of the present invention, thicknesses of portions of the piezoelectric layer respectively facing a part of the pressure chambers of the plurality of pressure chambers may be measured in the thickness measuring step; and thicknesses of portions of the piezoelectric layer respectively facing other pressure chambers other than the part of the pressure chambers may be calculated by interpolating the measured thicknesses of the portions of the piezoelectric layer respectively facing the part of the pressure chambers. It is therefore not necessary to measure thickness of the piezoelectric layer with regards to all of the pressure chambers in the thickness measuring step, and the manufacturing steps can be therefore simplified.

In the method for manufacturing the piezoelectric actuator of the present invention, in the electrode forming step, the second electrodes may be formed such that the lengths in the predetermined direction of the second electrodes become the lengths determined in the electrode length determining step by forming a conductive layer entirely on the side of the piezoelectric layer opposite to the pressure chambers and then partially removing the conductive layer. In this case, the second electrodes can be formed in a comparatively easy and accurate manner by ensuring that the lengths of the second electrodes are the length determined in the electrode length determining step.

In the method for manufacturing the piezoelectric actuator of the present invention, the first electrode may be a common electrode formed continuously across the plurality of pressure chambers, on a surface of the vibration plate on a side opposite to the pressure chambers; and the second electrodes may be individual electrodes to which a drive voltage for deforming the piezoelectric layer is applied.

In the method for manufacturing the piezoelectric actuator of the present invention, the second electrodes formed in the electrode forming step may be arranged at areas which face central portions of the pressure chambers having a shape long in one direction, and may have a shape long in a longitudinal direction of the pressure chambers; and the lengths in the predetermined direction of the second electrodes, determined in the electrode length determining step, may be lengths in a short direction of the portions of the second electrodes facing the first electrode, the short direction being a direction orthogonal to the longitudinal direction; the method may include, before the electrode length determining step, a target value determining step of determining a design target value for the lengths in the short direction of the second electrodes; the target value determining step may include: a first step of obtaining a relationship among Tp, We/Wc and Dd, We/Wc being a ratio of We and Wc, wherein the thickness of the piezoelectric layer is Tp, the length in the short direction of the portions of the second electrodes facing the first electrode is We, the length in the short direction of the pressure chambers is Wc, and an amount of displacement of the portion of the vibration plate facing the center of the pressure chambers is Dd; and a second step of determining a design target value Tp0 for the thickness of the piezoelectric layer which is to be the predetermined reference thickness, a design target value Dd0 for the amount of displacement Dd, and a design target value We0/Wc0 for We/Wc based on the relationship among Tp, We/Wc, and Dd obtained in the first step; and in the second step, a value for We0/Wc0 may be determined in a range We0/Wc0≦0.52, or a range of We0/Wc0≧0.60.

When the second electrodes formed in the electrode forming step have a shape long in the longitudinal direction of the pressure chambers, the lengths in the short direction of the portions of the second electrodes facing the first electrode exert a substantial influence on the deformation of the piezoelectric layer. Accordingly, in the electrode length determining step, the length in the short direction of the second electrode is determined to be an appropriate value. Before determining the lengths in the short direction of the second electrodes, the design target value for the lengths in the short direction of the second electrodes is determined in the electrode length determining step, and then in the target value determining step, the lengths in the short direction of the second electrodes are adjusted, from the design target value, according to the amount of deviation of the thicknesses of the piezoelectric layer.

In the target value determining step, first, in the first step, the relationship among Tp, We/Wc, which is a ratio of We and Wc, and Dd wherein the thickness of the piezoelectric layer is Tp, the length in the short direction of the second electrodes is We, the length in the short direction of the pressure chambers is Wc, and the amount of displacement of the portion of the vibration plate facing the center of the pressure chambers is Dd is obtained. In the second step, the design target value Tp0 for the thickness of the piezoelectric layer, and the design target value Dd0 of the amount of displacement Dd, and the design target value We0/Wc0 for We/Wc are obtained. It is understood from the relationship among Tp, We/Wc, and Dd obtained in the first step that the value of Dd is a local minimum value in the vicinity of We/Wc=0.56 regardless of other conditions such as the thickness of the vibration plate and drive voltage or the like. In the vicinity of the local small value, change in Dd with respect to We/Wc is small and a substantially large amount of adjustment from the design target value for We/Wc is therefore required in order to compensate for the deviation of the thickness Tp of the piezoelectric layer. The amount of adjustment of We/Wc from the design target value being large means that there is quite large fluctuation in We between the plurality of second electrodes. The design target value We0/Wc0 for We/Wc is therefore preferable to be in a range of We0/Wc0≦0.52, or a range of We0/Wc0≧0.60 in which change in Dd becomes greater to some extent.

In the method for manufacturing the piezoelectric actuator of the present invention, the value We0/Wc0 may be determined in the range of We0/Wc0≦0.52 in the second step. This is because in the range of We0/Wc0≦0.52, electrostatic capacitance is smaller than in the range of We0/Wco≧0.60, and the drive efficiency of the piezoelectric actuator is therefore high.

In the method for manufacturing the piezoelectric actuator of the present invention, in the step of forming the second electrodes, the surface areas of the portions of the second electrodes overlapping with the first electrode in a plane view may be adjusted according to an amount of electrostatic capacitance between the first electrode and the portions of the second electrodes overlapping with the first electrode in a plane view. It is therefore possible to further suppress the fluctuation in electrostatic capacitance between each electrode corresponding to each of the pressure chambers, and a piezoelectric actuator having further satisfactory performance can be manufactured.

According to a third aspect of the present invention, there is provided a liquid transporting apparatus including a channel unit having a plurality of pressure chambers arranged along a plane, and a piezoelectric actuator which is provided on a surface of the channel unit and which selectively changes volumes of the plurality of pressure chambers, the piezoelectric actuator including: a vibration plate covering the plurality of pressure chambers; a piezoelectric layer arranged on a side of the vibration plate opposite to the plurality of pressure chambers; a first electrode provided at an area of the piezoelectric layer on a side of the plurality of pressure chambers, the area facing the plurality of pressure chambers; and second electrodes provided at areas of the piezoelectric layer on a side opposite to the plurality of pressure chambers, each of the areas facing one of the pressure chambers and the first electrode; wherein lengths in a predetermined direction of the second electrodes at portions facing the first electrode differ according to thicknesses of the piezoelectric layer at portions each of which is interposed between the first electrode and one of the second electrodes.

In the liquid transporting apparatus of the present invention, the lengths in the predetermined direction of the second electrodes at the portions facing the first electrode may be adjusted according to an amount of deviation of the thicknesses, from a predetermined reference thickness, of the piezoelectric layer at the portions each of which is disposed between the first electrode and one of the second electrodes.

In the liquid transporting apparatus of the present invention, even in cases where there is fluctuation in the thickness of the piezoelectric layer, the lengths in a predetermined direction of the portions of the second electrodes, which face the first electrode and which generate an electric field in the piezoelectric layer, are adjusted according to the thicknesses of the piezoelectric layer, or more specifically, according to the amount of deviation of the thicknesses of the piezoelectric layer from a predetermined reference value so as to compensate for the fluctuation in the thickness of the piezoelectric layer. It is therefore possible to realize a liquid transporting apparatus in which the amount of fluctuation in the amount of deformation of the vibration plate is small for each of the pressure chambers. Because of this, in the liquid transporting apparatus of the present invention, the lengths in the predetermined direction of the second electrodes differ depending on the thicknesses of the piezoelectric layer at the portions each of which is interposed with the first electrode and one of the second electrodes.

According to a fourth aspect of the present invention, there is provided a method for manufacturing a liquid transporting apparatus including a channel unit having a plurality of pressure chambers arranged along a plane, and a piezoelectric actuator which is provided on a surface of the channel unit and which selectively changes volumes of the plurality of pressure chambers, the method including: a piezoelectric layer forming step of forming a piezoelectric layer on a surface of a vibration plate which covers the pressure chambers and which has a first electrode provided on a surface of the vibration plate, the piezoelectric layer being formed on the surface of the vibration plate provided with the first electrode, the first electrode being provided at an area of the vibration plate which faces the pressure chambers, the area being on a side of the vibration plate opposite to the pressure chambers; a thickness measuring step of measuring thicknesses of the piezoelectric layer at areas each of which overlaps with one of the pressure chambers and the first electrode in a plane view;

and a step of forming second electrodes on a surface of the piezoelectric layer on a side opposite to the first electrode by adjusting lengths in a predetermined direction of the second electrodes according to the measured thicknesses of the piezoelectric layer.

According to the method for manufacturing the liquid transporting apparatus of the present invention, the step of forming the second electrodes may further include an electrode length determining step of determining lengths of portions of the second electrodes in a predetermined direction, the portions facing the first electrode, and the second electrodes facing at least partially the first electrode with the piezoelectric layer being interposed between the first and second electrodes, the lengths being determined according to the thicknesses of the piezoelectric layer measured in the thickness measuring step, or more specifically, according to an amount of deviation of the thicknesses of the piezoelectric layer measured in the thickness measuring step from a predetermined reference thickness set in advance; and an electrode forming step for forming the second electrodes on a surface of the piezoelectric layer on a side opposite to the vibration plate such that the lengths in the predetermined direction of the portions facing the first electrode become the lengths determined in the electrode length determining step.

In the method for manufacturing the liquid transporting apparatus of the present invention, even when the thickness of the piezoelectric layer fluctuates in relation to the plurality of pressure chambers, in the electrode length determining step, the fluctuation in the thickness of the piezoelectric layer is compensated for by determining the lengths of the second electrodes in the predetermined direction according to the thicknesses of the piezoelectric layer, and more specifically according to the amount of deviation of the thicknesses of the piezoelectric layer from the predetermined references thickness, thereby making it possible to make the fluctuation in the amount of deformation of the vibration plate to be small.

BRIEF DESCRIPTION OF THE DRAWINGS

FIG. 8 (FIGS. 8A to 8F) is a diagram showing a process for manufacturing an ink-jet head, wherein

FIG. 18 (FIGS. 18A to 18F) is a diagram showing a process for manufacturing an ink-jet head of a second embodiment, wherein

PREFERRED EMBODIMENTS OF THE INVENTION

The following is an explanation of a first embodiment of the present invention. This first embodiment is an example in which the present invention is applied to an ink-jet head for jetting ink from a nozzle onto recording paper, as a liquid transporting apparatus.

Figure 1:
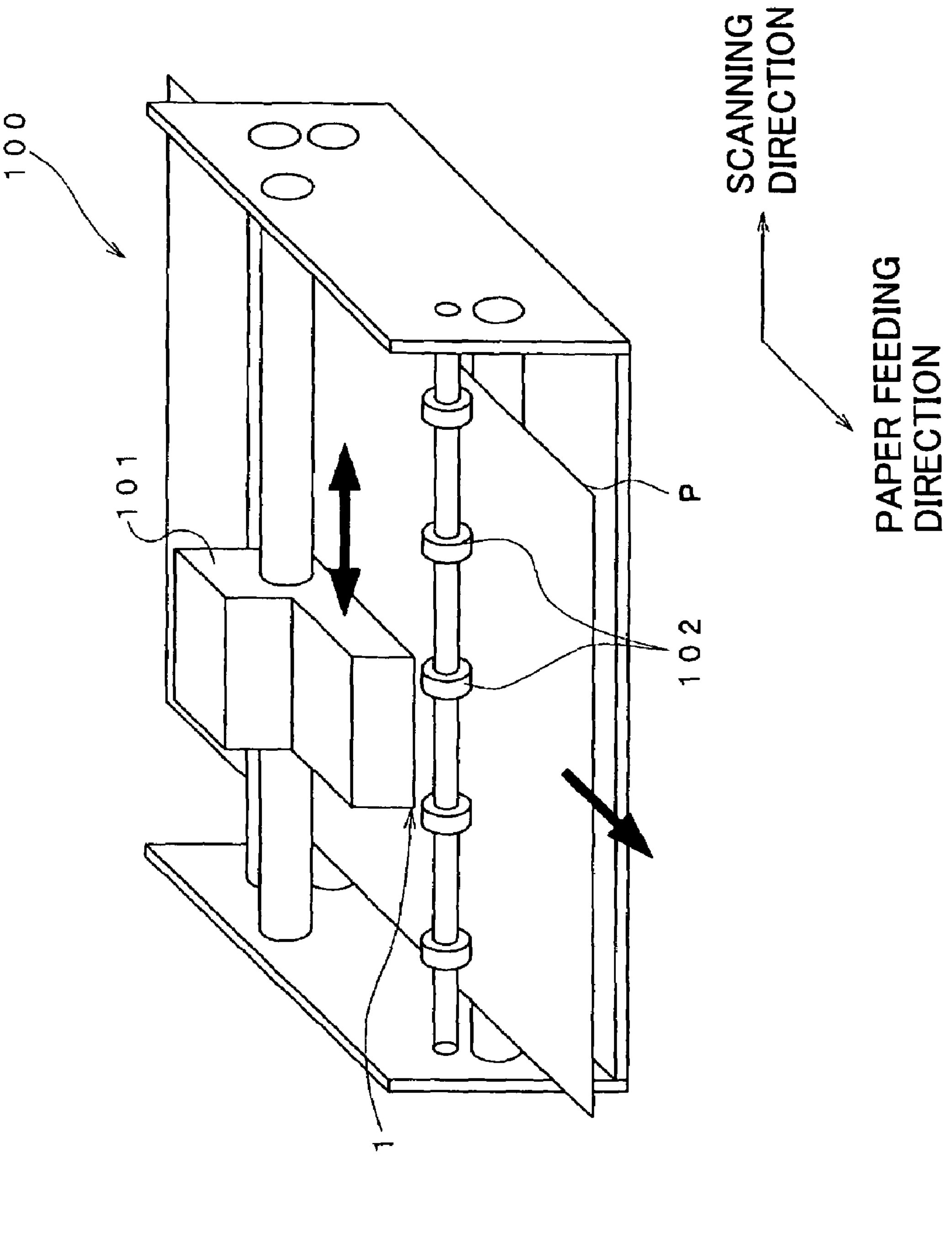
FIG. 1 is a schematic perspective view of an ink-jet head of a first embodiment of the present invention.

First, a brief explanation is given of an ink-jet printer 100 provided with an ink-jet head 1. As shown in FIG. 1, the ink-jet printer 100 is provided with a carriage 101 capable of moving in a left and right direction of FIG. 1, a serial-type ink-jet head 1 arranged in a carriage 101 and capable of jetting ink onto recording paper P, and transport rollers 102 for transporting recording paper P to the forward direction of FIG. 1, and the like. The ink-jet head 1 moves in a left and right direction (scanning direction) integrally with the carriage 101 to jet ink onto the recording paper P from ejection ports of nozzles 20 (see FIG. 2 to FIG. 5) formed in an ink discharge surface of a lower surface of the ink-jet head 1. The recording paper P recorded thereon by the ink-jet head 1 is then discharged forward (paper feeding direction) by the transport rollers 102.

Next, a detailed explanation is given of an ink-jet head 1 with reference to FIG. 2 to FIG. 5. As shown in FIG. 2 to FIG. 5, the ink-jet head 1 includes a channel unit 2 in which an individual ink channel 21 (see FIG. 4) including a pressure chamber 14 is formed in the ink channel, and a piezoelectric actuator 3 laminated on an upper surface of the channel unit 2.

Figure 4:
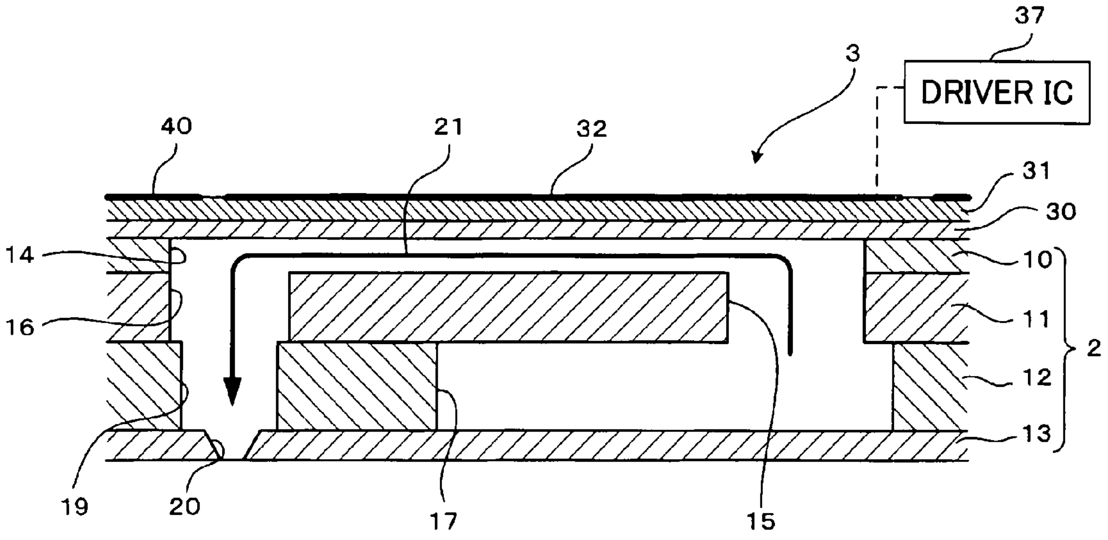
FIG. 4 is a cross-sectional view along line IV-IV of FIG. 3.
Figure 5:
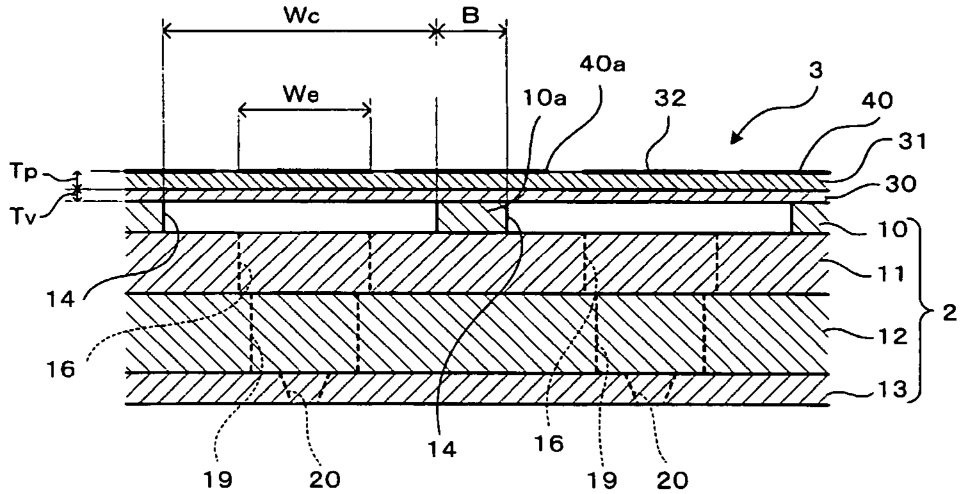
FIG. 5 is a cross-sectional view along line V-V of FIG. 3.

First, an explanation is given of the channel unit 2. As shown in FIG. 4 and FIG. 5, the channel unit 2 includes a cavity plate 10, a base plate 11, a manifold plate 12, and a nozzle plate 13, and these four plates 10 to 13 are adhered together in a laminated state. Of these plates, the cavity plate 10, the base plate 11 and the manifold plate 12 are stainless steel plates, and an ink channel such as a manifold 17 and the pressure chamber 14 or the like (which will be described later) can easily be formed in the three plates 10 to 12 by etching. Further, the nozzle plate 13 is formed of a high-molecular synthetic resin material such as, for example, polyimide or the like, and is joined to a lower surface of the manifold plate 12. Alternatively, this nozzle plate 13 may also be formed of a metal material such as stainless steel or the like similar to the three plates 10 to 12.

As shown in FIG. 2 to FIG. 5, a plurality of pressure chambers 14 are formed along a plane in the cavity plate 10. These pressure chambers 14 are open to a side (an upper side in FIG. 4) of a vibration plate 30 which will be described later. Further, the pressure chambers 14 are arranged in two rows along the paper feeding direction (vertical direction in FIG. 2). Each of the pressure chambers 14 is formed so as to be long in a scanning direction (left and right direction in FIG. 2) and be substantially elliptical in shape in a plane view. Further, an ink supply port 18 communicating with an ink tank (not shown) is formed in the cavity plate 10.

Figure 2:
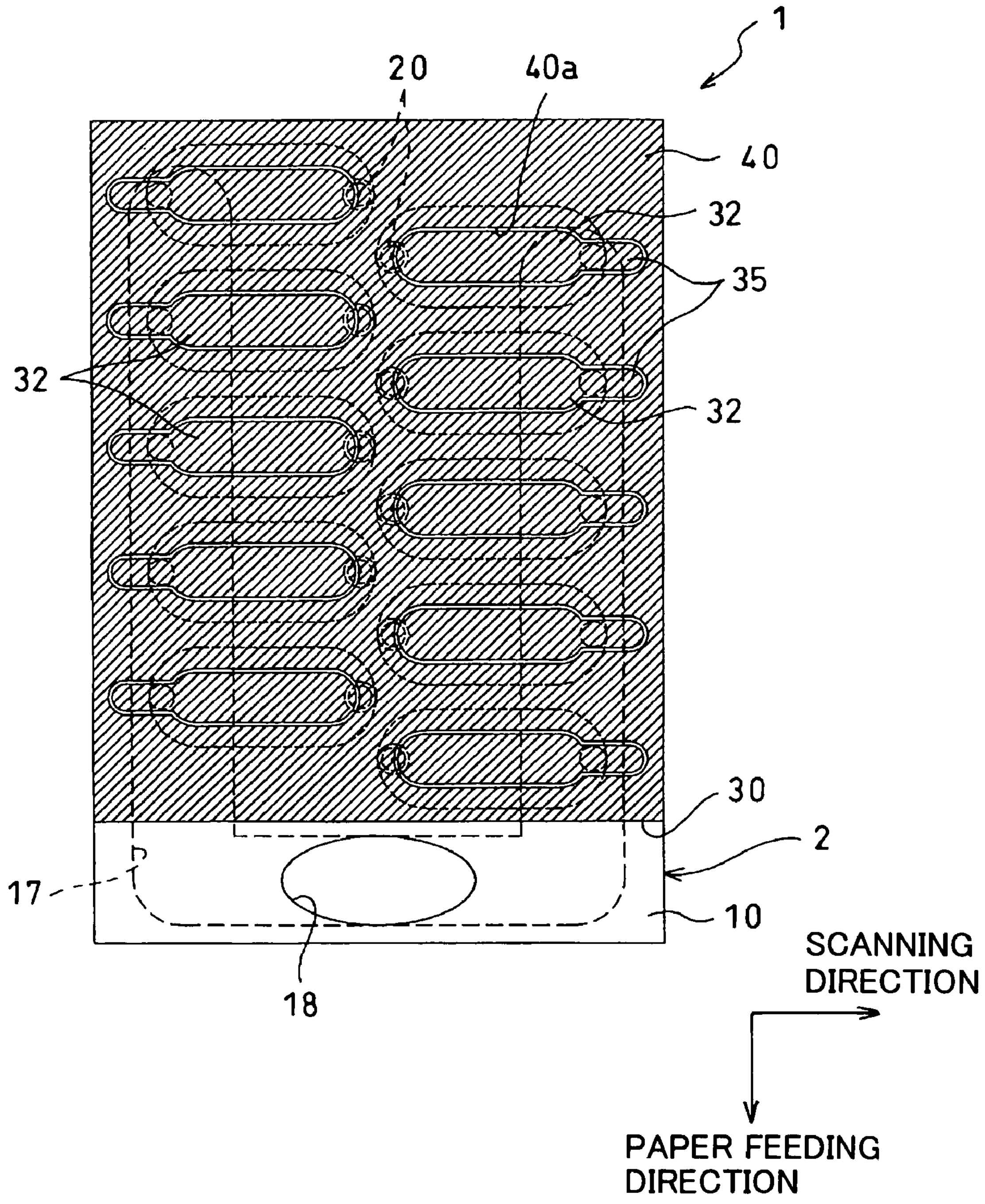
FIG. 2 is a plan view of an ink-jet head.
Figure 3:
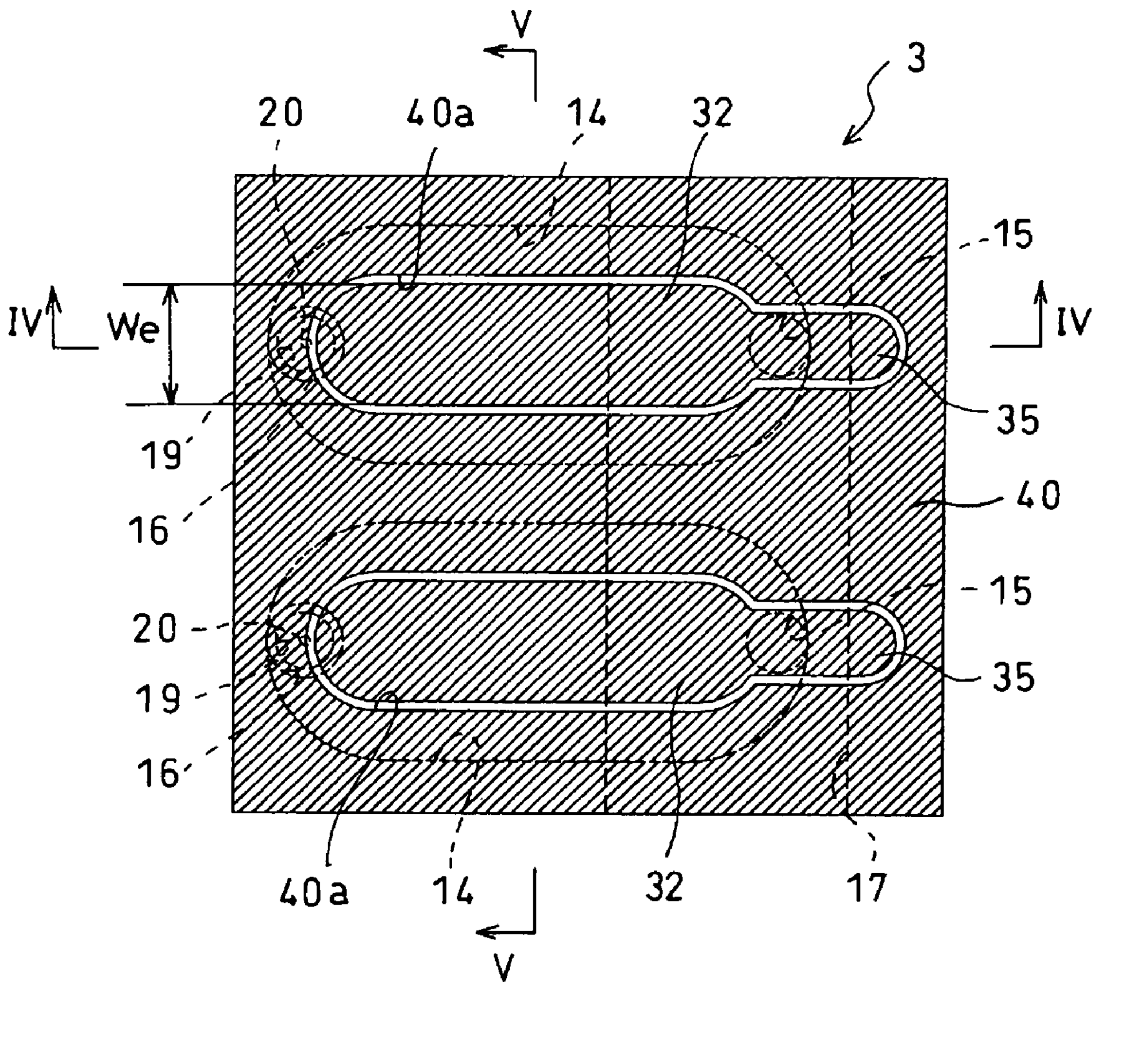
FIG. 3 is a partial magnified view of FIG. 2.

As shown in FIG. 3 and FIG. 4, communicating holes 15, 16 are formed in the base plate 11 at positions overlapping in a plane view both end portions of the associated pressure chambers 14 respectively in a long axis direction of the pressure chamber. Further, in the manifold plate 12, a manifold 17 is formed. The manifold 17 extends in the paper feeding direction (vertical direction in FIG. 2) and overlaps in a plane view with one of the left and right end portions of the pressure chambers 14 in FIG. 2. Ink is supplied from an ink tank (not shown) via the ink supply port 18 to the manifold 17. A communicating hole 19 is also formed at a position overlapping in a plane view with an end portion of each of the pressure chambers 14 on a side opposite to the manifold 17. Moreover, in the nozzle plate 13, a plurality of nozzles 20 are formed at positions overlapping in a plane view with the plurality of communicating holes 19 respectively. The nozzles 20 are formed, for example, by means of an excimer laser process on a substrate of a high-molecular synthetic resin such as polyimide.

Further, as shown in FIG. 4, the manifold 17 communicates with the pressure chamber 14 via the communicating hole 15 and the pressure chamber 14 communicates with the nozzle 20 via the communicating holes 16 and 19. Thus, an individual ink channel 21 from the manifold 17, via a pressure chamber 14, to the nozzle 20 is formed in the channel unit.

Next, an explanation is given of the piezoelectric actuator 3. As shown in FIG. 2 to FIG. 5, the piezoelectric actuator 3 includes a conductive vibration plate 30 arranged on an upper surface of the channel unit 2, a piezoelectric layer 31 formed on an upper surface (surface on the side opposite to the pressure chamber 14) of the vibration plate 30, and a plurality of individual electrodes formed on an upper surface of the piezoelectric layer 31 to correspond to the plurality of pressure chambers 14 respectively.

The vibration plate 30 is a plate composed of a metal material and is substantially rectangular in shape in a plane view, and may be formed of, for example, an iron alloy such as stainless steel or the like, a copper alloy, a nickel alloy, or a titanium alloy or the like. This vibration plate 30 is laminated on and bonded to an upper surface of the cavity plate 10 to cover the plurality of pressure chambers 14. Further, this vibration plate 30 also serves as a common electrode facing the plurality of individual electrodes 32 and causes an electric field to act on the piezoelectric layer 31 between the individual electrodes 32 and the vibration plate 30. The vibration plate 30 is connected to ground and is held at ground potential.

A piezoelectric layer 31, mainly composed of lead zirconium titanate (PZT) which is a solid solution of lead titanate and lead zirconate and is ferroelectric, is formed on the upper surface of this vibration plate 30. This piezoelectric layer 31 is formed entirely over the whole upper surface of the vibration plate 30 so as to span across the plurality of pressure chambers 14. This piezoelectric layer 31 can be formed as an extremely thin layer by an aerosol deposition method (AD method) in which very fine particles of a piezoelectric material are mixed with a carrier gas and blown against a substrate so as to collide with the substrate at high speed and be deposited on the substrate. Alternatively, it is possible to form the piezoelectric layer 31 by a sputtering method, a chemical vapor deposition method (CVD method), a sol-gel method, or a hydrothermal synthesis method.

A plurality of individual electrodes 32 which have an elliptical plane shape which is long in the scanning direction (left and right direction in FIG. 2), similar to the pressure chambers 14, and which are smaller in size than the pressure chambers 14 to some extent are formed on the upper surface of the piezoelectric layer 31. Each of the individual electrodes 32 is arranged at an area facing a central portion of the corresponding pressure chamber 14 in a plane view. Each of the individual electrodes 32 is formed of a conductive material such as gold, copper, silver, palladium, platinum, or titanium or the like. Further, a plurality of terminals 35, each of which extends in the scanning directions from an end portion of one of the individual electrodes 32 on a side of the manifold 17, are also formed on the upper surface of the piezoelectric layer 31. As shown in FIG. 4, these terminals 35 are electrically connected to a driver IC 37 via a wiring member (not shown) having flexibility such as a flexible printed circuit board or the like, and drive voltages are selectively supplied from the driver IC 37 to the plurality of individual electrodes 32 via the terminals 35.

The plurality of individual electrodes 32 and the plurality of terminals 35 are formed in the following manner. Namely, as shown in FIG. 2 and FIG. 3, a conductive layer 40 formed of metallic material is formed entirely over the upper surface of the piezoelectric layer 31. Then, a plurality of closed-loop-shaped grooves 40*a,* corresponding to the plurality of pressure chambers 14 respectively, are formed by partially removing the conductive layer 40 by laser processing employing a carbon dioxide gas laser or the like. By doing so, the plurality of individual electrodes 32 and the plurality of terminals 35 are respectively formed in the inside of the plurality of grooves 40*a*. The plurality of individual electrodes 32 and the plurality of terminals 35 are then completely isolated from the portion of the conductive layer 40 on the outer side by the grooves 40*a*.

Next, an explanation is given of the operation of the piezoelectric actuator 3. When a drive voltage is selectively applied from the driver IC 37 to the plurality of individual electrodes 32, the electric potential of the individual electrodes 32 which are disposed on the upper side of the piezoelectric layer 31 and to which the drive voltage is supplied differs from that of the vibration plate 30 which serves as a common electrode held at ground potential and which is disposed on the lower side of the piezoelectric layer 31, and an electric field in a vertical direction is therefore generated in portions of the piezoelectric layer 31 sandwiched between the individual electrodes 32 and the vibration plate 30. When the electric field is generated, the portions of the piezoelectric layer 31 directly below the individual electrode 32 to which the drive voltage is applied contract in a horizontal direction orthogonal to a vertical direction which is a direction of polarization. At this time, since the vibration plate 30 deforms so as to project toward the pressure chambers 14 in accompaniment with the contraction of the piezoelectric layer 31, the volume within the pressure chambers 14 is then decreased and a pressure is applied to ink in the pressure chambers 14, thereby discharging droplets of ink from the nozzles 20 communicating with the pressure chambers 14.

As described above, when a piezoelectric material is deposited on the vibration plate 30 using the AD method and the sputtering method or the like so as to form the piezoelectric layer 31, the thickness of the piezoelectric layer 31 may deviate and fluctuate by a certain amount from a predetermined target value (design value) so as to be non-uniform. In the case that the thickness of the piezoelectric layer 31 fluctuates with respect to the plurality of pressure chambers 14 for a single piezoelectric actuator 3, the amount of deformation of the vibration plate 30 is different for each of the pressure chambers 14. However, the amount of deformation of the vibration plate 30 influences ink jetting characteristics such as ink droplet volume and droplet speed or the like, and consequently, these jetting characteristics fluctuate for each of the pressure chambers 14 and the printing quality therefore deteriorates. Further, when the fluctuation occurs in piezoelectric layers 31 between a plurality of ink-jet heads 1, the thicknesses of the piezoelectric layers 31 deviate from a predetermined range so that it is not possible to implement a printing of the desired quality. In this case, yield rate falls.

In the piezoelectric actuator 3 of the first embodiment, a width We (length in a short direction orthogonal with a longitudinal direction of the pressure chambers 14: see FIG. 5) of the individual electrodes 32 is determined based on an amount of deviation by which the thickness of the piezoelectric layer 31, actually measured in a manufacturing stage for the ink-jet head 1, deviates from a predetermined reference thickness set in advance. Namely, it is possible to compensate for the fluctuation in the thickness of the piezoelectric layer 31 by adjusting the width We of the individual electrodes 32. An explanation will be given in the followings about a method for determining a width We of individual electrodes 32 based on the amount of deviation, from a reference value, of the thickness of the piezoelectric layer 31.

Figure 6:
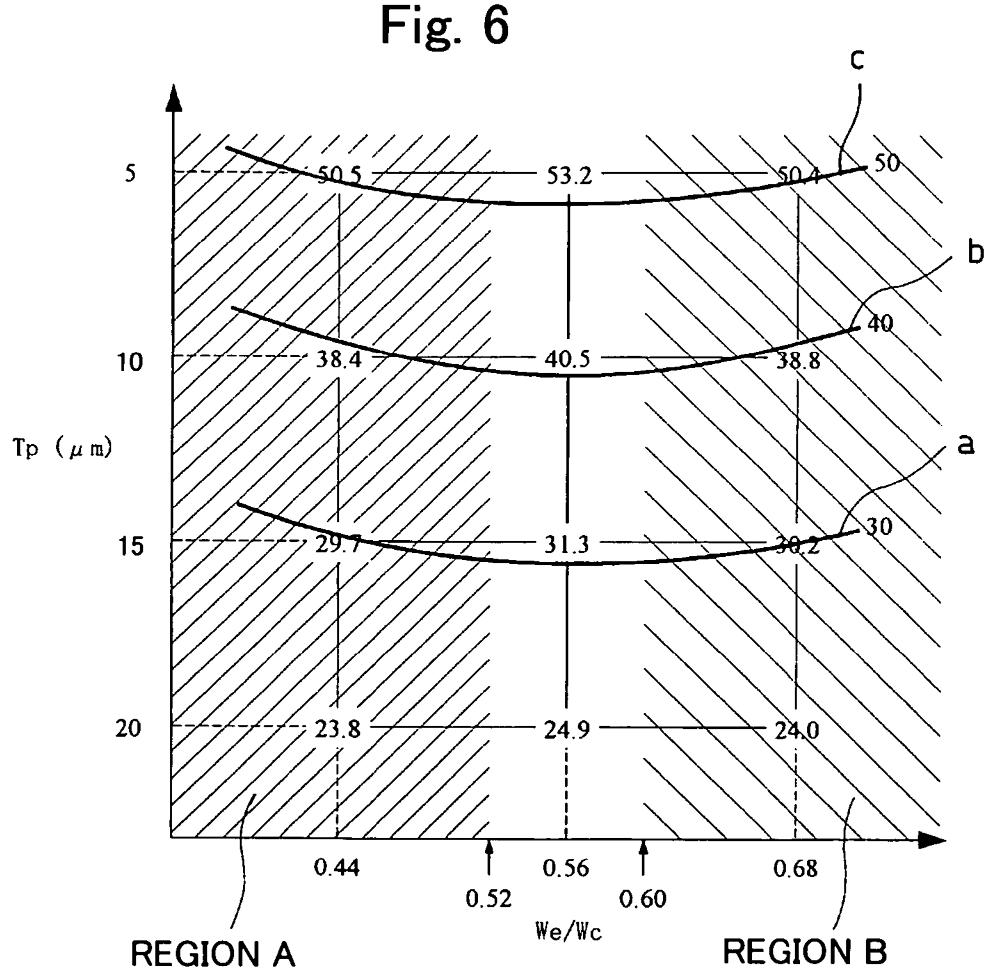
FIG. 6 is a diagram showing a relationship between a thickness Tp of a piezoelectric layer, a ratio We/Wc of a width We of an individual electrode and a width Wc of a pressure chamber, and a maximum amount of displacement Dd expressing an amount of deformation of a vibration plate.

First, the relationship between the thickness Tp of the piezoelectric layer 31, the width We of the individual electrode 32, and the amount of displacement Dd (hereinafter referred to as maximum amount of displacement Dd) of the vibration plate 30 at a position facing a central portion of each of the pressure chambers 14 occurring when the piezoelectric actuator 3 is driven is obtained through structural analysis and experimentation using the Finite Element Method: FEM). FIG. 6 shows change in the maximum amount of displacement Dd (nm) with respect to the thickness Tp (μm) of the piezoelectric layer 31 and We/Wc which is the ratio of We to Wc when the structural analysis using FEM was carried out wherein width Wc of a pressure chamber 14 is 250 μm, width B of a side wall section 10*a* which is a portion where a pressure chamber 14 is not formed is 89 μm, thickness Tv of the vibration plate 30 is 20 μm, and drive voltage is 20V as shown, for example, in FIG. 5.

Figure 7:
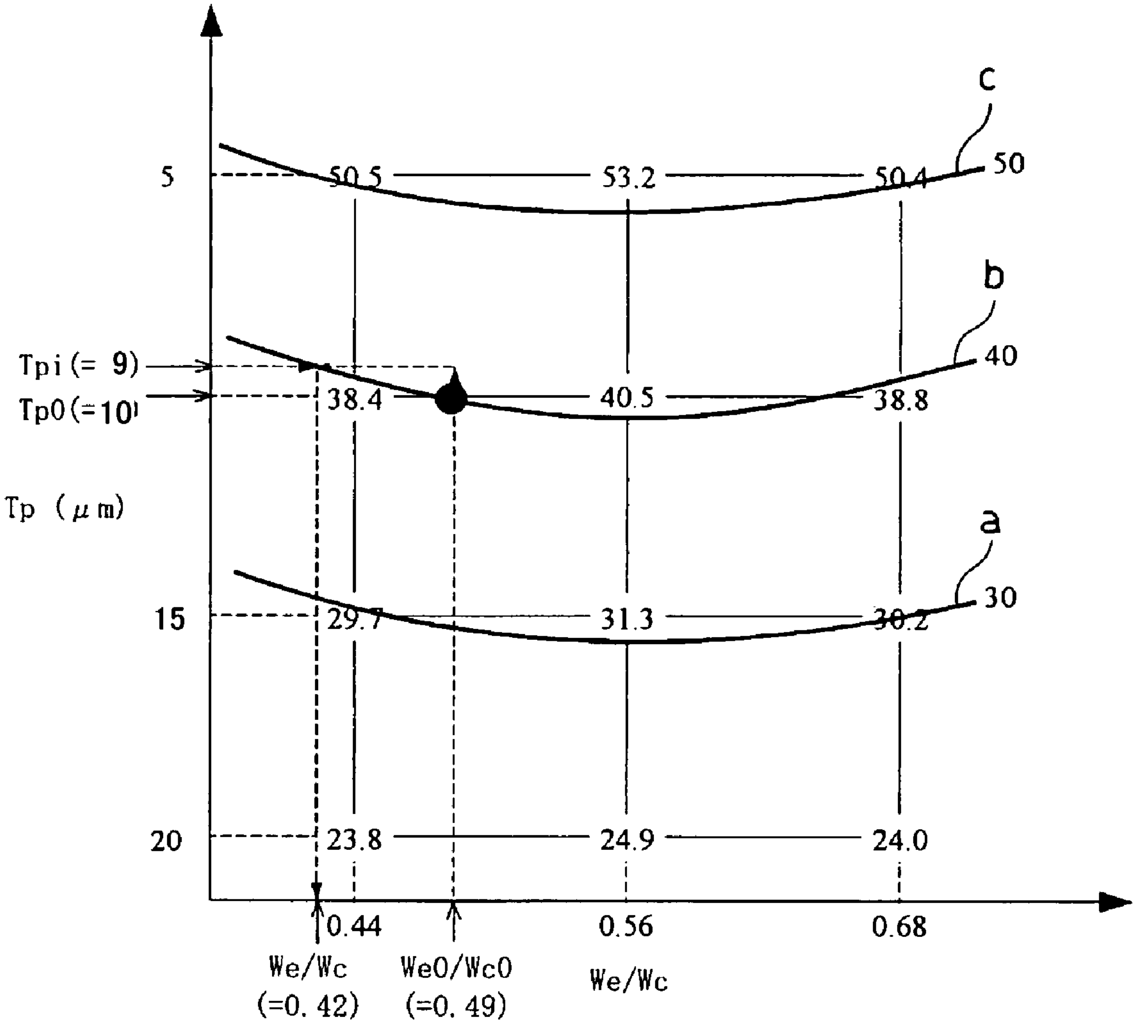
FIG. 7 is a diagram illustrating a method for a case of determining a value of We/Wc from a measured value Tpi for thickness of a piezoelectric layer.

Here, numerals in the graph in FIG. 6 indicate the value of Dd, and shows that when the value of We/Wc for the horizontal axis and the value of Tp for the vertical axis are changed, the value of Dd becomes a numerical value described at each of the positions of the point of intersections of We/Wc and Tp. Further, curve a, curve b and curve c in FIG. 6 show lines connecting points where Dd are predetermined values (Dd=30, 40, 50). For example, as shown in FIG. 7, it is taken that the thickness Tpi of the piezoelectric layer 31 actually measured is 9 μm when a design target value We0/Wc0 for We/Wc is 0.49, a reference thickness (design target value) Tp0 for the thickness of the piezoelectric layer 31 is 10 μm, and a design target value Dd0 for maximum displacement is 40 nm (on curve b). At this time, the value We/Wc is set to the value (We/Wc=0.42) of the point of intersection of the curve b and Tp=9 μm so that the maximum amount of displacement Dd becomes the design target value of 40 nm, and since Wc=250 μm, then We=105 μm can be obtained. Namely, the width We of the individual electrode 32 can be determined from the graph of FIG. 6 according to the amount of deviation, from a reference thickness Tp0, of the measured value Tpi for the thickness of the piezoelectric layer 31 such that the maximum amount of displacement Dd of the vibration plate 30 becomes the design target value (40 nm). It is therefore possible to compensate for the fluctuation in the thickness Tp of the piezoelectric layer 31 with the width We of the individual electrode 32.

As shown in FIG. 6, the value of Dd becomes a local minimum value when We/Wc is 0.56. In the vicinity of this, with respect to We/Wc, the gradient of a curve (for example, curves a, b, c) for which Dd is constant is small. It is therefore necessary to perform a substantial amount of adjustment from the design value for We/Wc in order to compensate for an amount of deviation ΔTp (Tpi-Tp0) for Tp. The amount of adjustment of We/Wc being large means that there is quite large fluctuation in the width We between the plurality of individual electrodes 32. In this event, electrostatic capacitance between the individual electrode 32 and the vibration plate 30 varies among the pressure chambers 14. In such a case, even when a drive signal of the same drive waveform is supplied to each individual electrode 32, and the drive voltage is applied at a certain predetermined timing, the actual timing at which pressure is applied to ink within the pressure chamber 14 varies among the pressure chambers 14, and print quality therefore falls. Accordingly, the design target value We0/Wc0 for We/Wc is set to a range (region A of FIG. 6) of not more than 0.52 or a range (region B of FIG. 6) of not less than 0.60 in each of which a gradient of curve where Dd=constant is relatively large. Further, in region A, the electrostatic capacitance is smaller than that in region B, and drive efficiency of the piezoelectric actuator 3 becomes high. It is therefore desirable to set the design target value We0/Wc0 for We/Wc to a value within region A.

Next, an explanation will be given with reference to FIG. 8 about a method for manufacturing the ink-jet head 1. First, the design target value (reference thickness) Tp0 for thickness Tp of the piezoelectric layer 31, design target value We0 for the width We of each individual electrode 32, and design target value Dd0 for the maximum amount of displacement Dd of the vibration plate 30 are respectively determined (target value determining step).

In the target value determining step, first, the relationship (FIG. 6) between the thickness Tp of the piezoelectric layer 31, the ratio We/Wc of the width We of the individual electrode 32 and the width Wc of the pressure chamber, and the maximum amount of displacement Dd of the vibration plate are obtained by experimentation and structural analysis using FEM, or the like (first step). Next, the design target value (reference thickness) Tp0 for the thickness of the piezoelectric layer, the design target value Dd0 for the maximum amount of displacement Dd, and the design target value We0/Wc0 for We/Wc are determined to be appropriate values based on the relationship of FIG. 6 (second step). Here, as described above, for the purpose of keeping the amount of adjustment of We as small as possible while compensating for the thickness Tp of the piezoelectric layer 31 with the width We of the individual electrode 32, the value of We0/Wc0 is determined in a range (region A of FIG. 6) of We0/Wc0≦0.52 or a range (region B of FIG. 6) of We0/Wc0≧0.60 which are apart from the local minimum value (We/Wc=0.56). It is preferable to determine We0/Wc0 in the range of the region A from the viewpoint of making the electrostatic capacitance small.

Figure 8A:
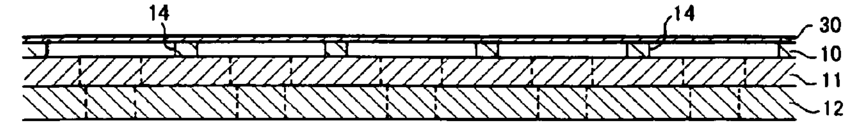
FIG. 8A shows a step for joining metal plates.

Next, holes that are to form the pressure chambers 14 and manifold 17 or the like are formed using etching or the like in the cavity plate 10, the base plate 11 and the manifold plate 12 which are formed of metal material. Further, the vibration plate 30 is formed by cutting a predetermined size from a metal sheet. Then, as shown in FIG. 8A, the four metal plates of the cavity plate 10, the base plate 11, the manifold plate 12 and the vibration plate 30 are joined together.

Figure 8B:
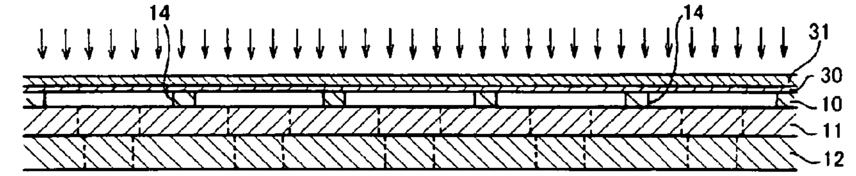
FIG. 8B shows a step for forming a piezoelectric layer.

Next, as shown in FIG. 8B, the piezoelectric layer 31 is formed by depositing particles of a piezoelectric material on a surface of the vibration plate 30 opposite to the pressure chambers 14 by using the AD method, the sputtering method, the CVD method, the sol-gel method, or the hydrothermal synthesis method, or the like (piezoelectric layer forming step). However, as described above, the thickness of the piezoelectric layer 31 formed in this piezoelectric layer forming step may deviate in some cases from a predetermined target value so that there may be fluctuation with regards to a plurality of pressure chambers 14 for one ink-jet head 1 or there may be fluctuation between a plurality of ink-jet heads 1. Accordingly, the fluctuation in the thickness of the piezoelectric layer 31 is then compensated for with the width We of individual electrodes 32, and thus fluctuation in the ink jetting characteristics due to the thickness of the piezoelectric layer 31 is suppressed. A series of steps for compensating for the thickness of the piezoelectric layer 31 with the widths of individual electrodes 32 are described in detail with reference to FIG. 8C to FIG. 8F and the flowchart of FIG. 9.

Figure 8C:
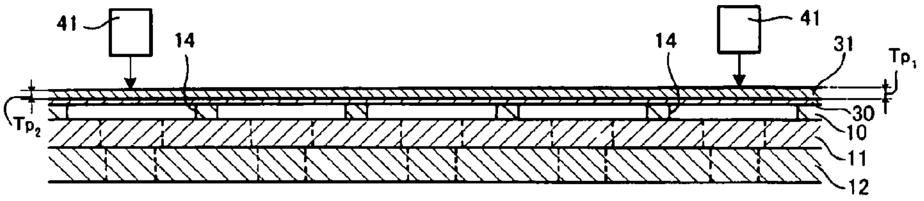
FIG. 8C shows a step for measuring thickness.
Figure 9:
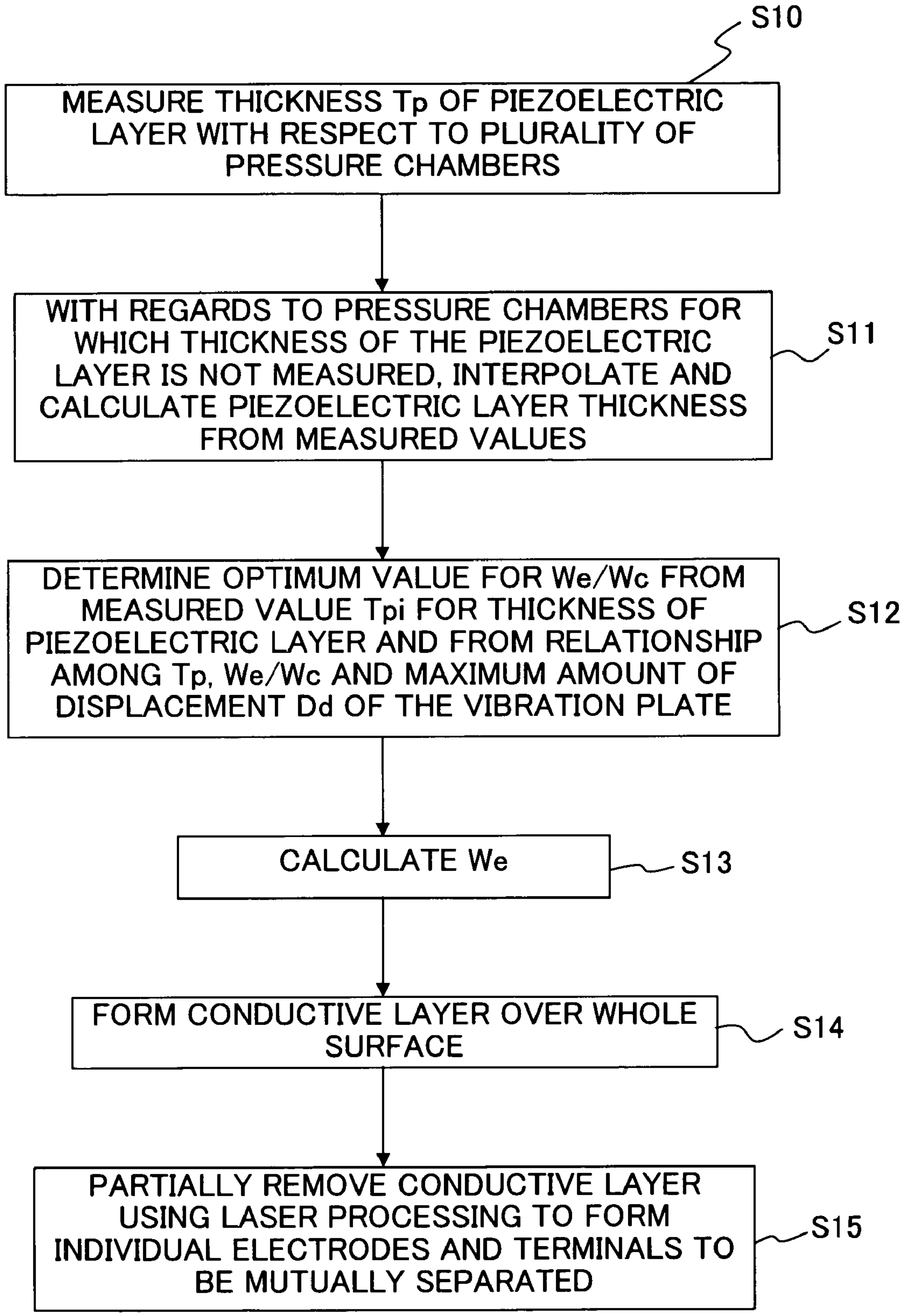
FIG. 9 is a flowchart of a step for determining a width of individual electrodes from the thickness of a piezoelectric layer.

First, as shown in FIG. 8C, thickness Tp of the areas in the piezoelectric layer 31 facing the pressure chambers 14 is measured using a laser displacement meter 41 or the like (thickness measuring step). Here, only the thicknesses of the portions of the piezoelectric layer 31 facing a part of the pressure chambers 14 (for example, two pressure chambers 14 arranged at both ends of five pressure chambers 14 arranged in a left and right direction of FIG. 8C) are measured using the laser displacement meter 41 (S10 of FIG. 9) and thicknesses of the portions of the piezoelectric layer 31 facing the other pressure chambers 14 are calculated through interpolation from the measured thicknesses of the portions of the piezoelectric layer 31 facing the part of the pressure chambers 14 (S11). In this case, since it is not necessary to measure the thicknesses of the piezoelectric layer 31 with regards to all of the pressure chambers 14, the thickness measurement step can be simplified. FIG. 8C shows the case in which a thickness Tp1 of the piezoelectric layer 31 at an area thereof facing the pressure chamber 14 at the right end is larger (thicker) than a thickness Tp2 of the piezoelectric layer 31 at an area thereof facing the pressure chamber 14 on the left end.

Next, as shown in FIG. 7, a value is determined for We/Wc such that the maximum amount of displacement Dd of the vibration plate 30 becomes a predetermined target value from the relationship (see FIG. 6) among thickness Tpi of the piezoelectric layer 31 measured (or calculated through interpolation) in the thickness measuring step, thickness Tp of the piezoelectric layer 31 obtained in advance, the ratio We/Wc that is the ratio of the width We of individual electrode 32 and the width Wc of pressure chamber 14, and maximum amount of displacement Dd of the vibration plate 30 at the time of driving of the piezoelectric actuator 3 (S12), and width We of individual electrode 32 is calculated (S13: electrode length determining step). For example, since the thickness Tp1 of the piezoelectric layer 31 at the area thereof facing the pressure chamber 14 at the right end and the thickness Tp2 of the piezoelectric layer 31 at the area thereof facing the pressure chamber 14 at the left end are different, a width We1 of an individual electrode 32 corresponding to the pressure chamber 14 at the right end and a width We2 of an individual electrode 32 corresponding to the pressure chamber 14 at the left end are determined to be values which are mutually different, as shown in FIG. 8E.

Figure 8D:
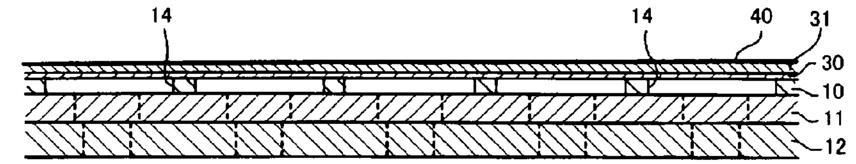
FIG. 8D shows a step for forming a conductive layer.
Figure 8E:
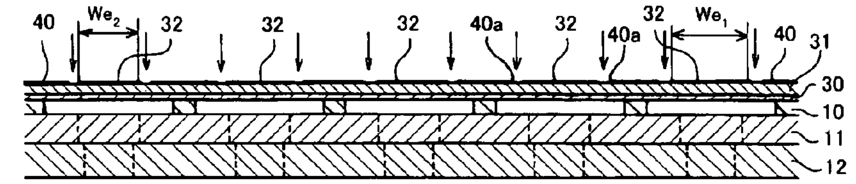
FIG. 8E shows a step for forming individual electrodes.
Figure 8F:
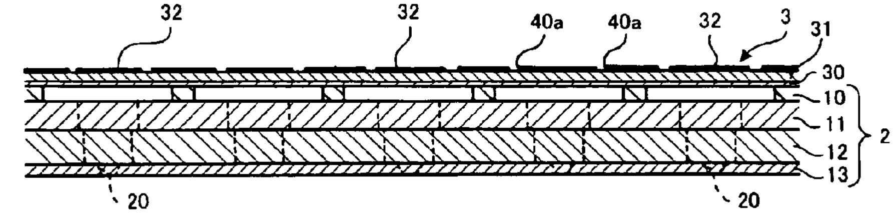
FIG. 8F shows a step for joining a nozzle plate.

Next, as shown in FIG. 8D, a conductive layer 40 is formed entirely over the upper surface of the piezoelectric layer 31 (S14). Then, as shown in FIG. 8E, a plurality of closed loop-shaped grooves 40*a* (see FIG. 2, FIG. 3) are formed by partially removing the conductive layer 40 using a carbon dioxide gas laser or the like such that the widths We of the individual electrodes 32, which are to be formed in the grooves, become the values determined as described above (S15). Then, as shown in FIG. 8F, the mutually isolated plurality of individual electrodes 32 and terminals 35 are formed (electrode forming step). When individual electrodes 32 are formed in this way by partially removing the conductive layer 40 formed over the whole surface using laser processing, it is possible to form the individual electrodes 32 of the determined widths We in a comparatively easy and reliable manner. Finally, as shown in FIG. 8F, the nozzle plate 13 is joined to the lower surface of the manifold plate 12, and the manufacture of the ink-jet head 1 is completed.

According to the ink-jet head 1 and method for manufacturing the ink-jet head 1 as explained above, the following effects are obtained. Even when there is a fluctuation in the thickness of the piezoelectric layer 31, the widths We of the individual electrodes 32 are adjusted according to the amount of deviation of the piezoelectric layer 31 such that the amount of deformation of the vibration plate 30 becomes a predetermined target value. The fluctuation in the thickness of the piezoelectric layer 31 can therefore be easily compensated, and the fluctuation in the amount of deformation of the vibration plate 30 becomes small. Accordingly, a fluctuation in ink jetting characteristics between the plurality of pressure chambers 14 (nozzles 20) for one ink-jet head 1 can be suppressed, thereby preventing the deterioration in the quality of printing. Further, fluctuation in the amount of deformation of the vibration plate 30 between the plurality of ink-jet heads 1 can be prevented, thereby preventing the yield from falling.

Next, an explanation will be given about modified embodiments in which various changes are made to the first embodiment. Here, elements or components of the modified embodiments having the same configuration as those of the first embodiment are given the same reference numerals and the descriptions therefore are omitted as appropriate.

First Modified Embodiment

Figure 10:
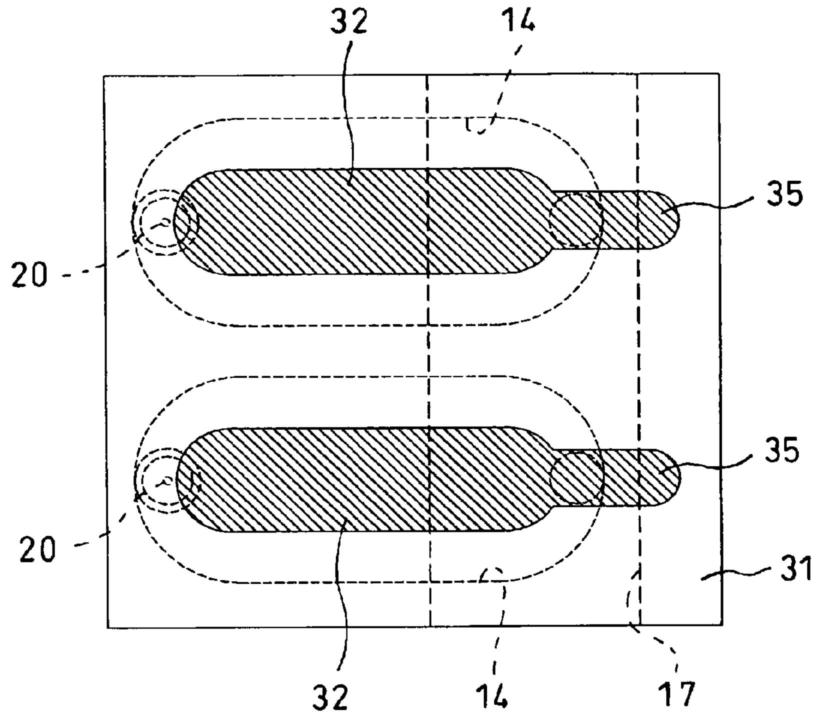
FIG. 10 is a magnified plan view of a first modified embodiment of the first embodiment, corresponding to FIG. 3.

In the first embodiment, the individual electrodes 32 and the terminals 35 are formed by forming the grooves 40*a* in the conductive layer 40 formed entirely across the whole upper surface of the piezoelectric layer 31. However, as shown in FIG. 10, is it also possible to remove the conductive layer 40 at portions in the outside of each of the individual electrodes 32 and the terminals 35.

Second Modified Embodiment

Figure 11:
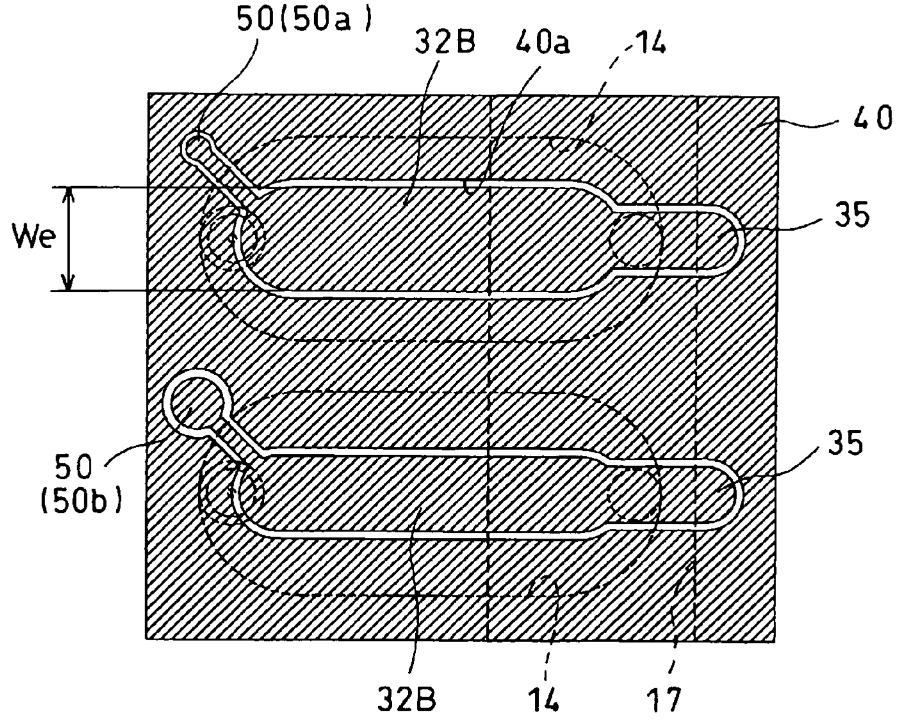
FIG. 11 is a magnified plan view of a second modified embodiment, corresponding to FIG. 3.

When widths of the plurality of individual electrodes 32 are determined to be mutually different values in order to compensate for the fluctuation in thickness of the piezoelectric layer 31, the surface areas of the individual electrodes 32, which correspond to the plurality of pressure chambers respectively, become mutually different in relation to the pressure chambers 14. In this case, electrostatic capacitance between each of the individual electrodes 32 and the vibration plate 30 is different for each of the pressure chambers 14. Then, in a pressure chamber 14 with a large electrostatic capacitance, the timing at which a pressure is actually applied to ink in the pressure chamber 14 is delayed, when the drive voltage is applied to an individual electrode 32 associated to this pressure chamber, as compared to a pressure chamber 14 of a small electrostatic capacitance. Thus, the timing varies for each of the pressure chambers 14. It is therefore preferable for the surface areas of the plurality of individual electrodes 32 to be equal in order to suppress the fluctuation in the electrostatic capacitance. For example, as shown in FIG. 11, an individual electrode 32B has an extending section 50 extending up to an area not facing the pressure chamber 14, and the surface areas of the extending sections may be determined according to the widths We of the associated individual electrodes 32B such that the surface areas of the plurality of individual electrodes 32B become equal. Namely, in FIG. 11, the surface area of an extending section 50 (50*b*) of a lower individual electrode 32B in which width We is small is greater than the surface area of an extending section 50 (50*a*) of an upper individual electrode 32B in which width We is large. The extending section 50 is arranged at are area that does not face the pressure chamber 14. Since the surface area of this extending section does not influence the amount of deformation of the vibration plate 30, there is therefore no fluctuation in ink jetting characteristics even if the surface areas of the extending sections 50 vary between the plurality of pressure chambers 14.

In addition, it is possible to adjust the surface area of each of the individual electrodes 32 such that the electrostatic capacitance between the individual electrodes 32 and the vibration plate 30 becomes same for each of the individual electrodes. The thickness of the piezoelectric layer between each of the individual electrodes 32 and the vibration plate 30 is already known through the actual measurement or the interpolation. Therefore, by further considering a slight differences in the thickness of the piezoelectric layer 31, it is possible to obtain a surface area for each of the individual electrodes 32 such that the electrostatic capacitance between the individual electrodes 32 and the vibration plate 30 becomes same for each of the individual electrodes 32. In this manner, it is possible to further suppress the fluctuation in electrostatic capacitance between the individual electrodes 32 and the vibration plate 30 by deriving the surface area of each of the individual electrodes 32 and by adjusting the surface areas of the extending sections 50 according to the derived surface areas of the individual electrodes, thereby obtaining satisfactory jetting characteristics.

Third Modified Embodiment

Figure 12:
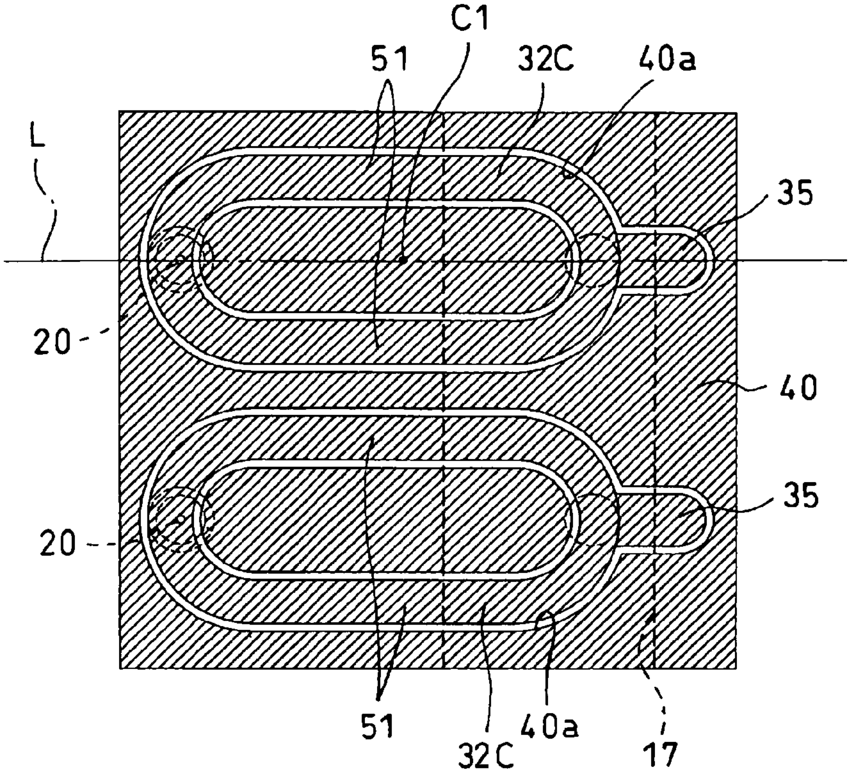
FIG. 12 is a magnified plan view of a third modified embodiment, corresponding to FIG. 3.

In the first embodiment, each of the individual electrodes 32 is formed at an area overlapping with a central portion of one of the pressure chambers 14. However, as shown in FIG. 12, each of the individual electrodes 32C may also be formed at an area overlapping with an edge portion of one of the pressure chambers 14, the edge portion being a portion other than the central portion of each of the pressure chambers 14. In this case, each of the individual electrodes 32C does not have to be formed in an annular shape along the edge of one of the pressure chambers 14 as shown in FIG. 12, but may be formed at least at two areas (upper and lower areas) 51 which are included in the edge portion of each of the pressure chambers, which are positioned on both sides respectively in relation to a central line L passing through a center Cl of each of the pressure chambers, and which extend substantially parallel to the longitudinal direction (left and right direction in FIG. 12) of each of the pressure chambers 14.

Fourth Modified Embodiment

Figure 13:
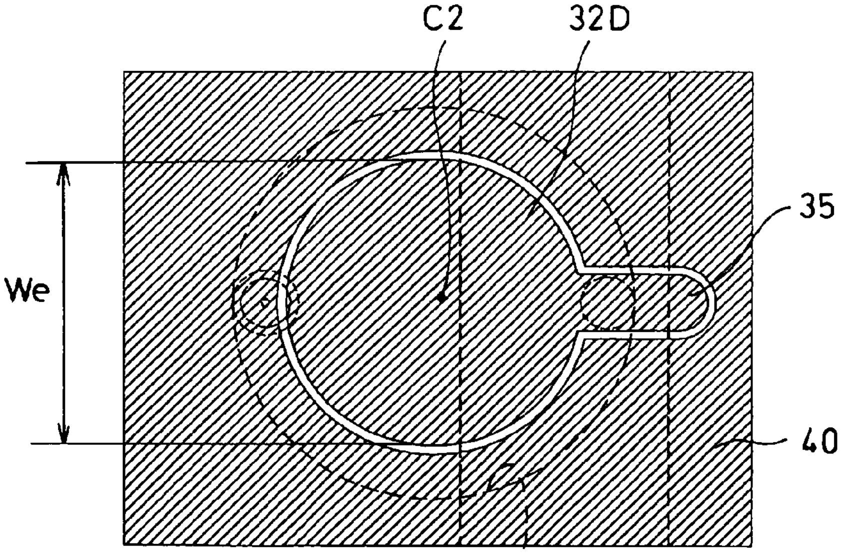
FIG. 13 is a magnified plan view of a fourth modified embodiment, corresponding to FIG. 3.

The shapes of the pressure chambers and individual electrodes are not limited to a shape which is long in one direction as in the first embodiment, and the pressure chambers and individual electrodes may be formed in other shapes such as, a circular shape, a rhombus, or a rectangular shape or the like. For example, as shown in FIG. 13, when a pressure chamber 14D is circular and an individual electrode 32D is also circular and is concentric with the pressure chamber 14D, a length We of the individual electrode 32D in a radial direction (a direction of a line passing through a center C2 of the surface area of the pressure chamber 14D) is determined to be an optimum value such that the maximum displacement of the vibration plate 30 becomes large.

Fifth Modified Embodiment

Figure 14:
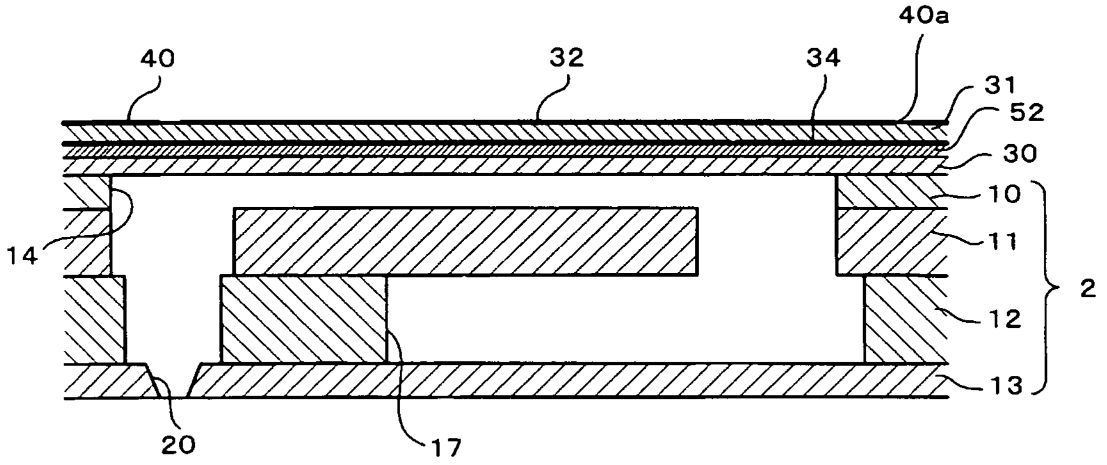
FIG. 14 is a cross-sectional view of a fifth modified embodiment, corresponding to FIG. 4.

In the first embodiment, the vibration plate 30 formed of a metallic material also serves as the common electrode which faces the plurality of individual electrodes 32 and causes an electric field to act on the intervening piezoelectric layer 31. However, separately from the vibration plate, a common electrode may also be formed on the upper surface (surface on a side opposite to the pressure chamber) of the vibration plate. In this case, when the vibration plate is formed of a metallic material, as shown in FIG. 14, it is necessary for the upper surface of the vibration plate 30 to be insulative by, for example, forming an insulating material layer 52 on the upper surface of the vibration plate 30 where a common electrode 34 is to be formed. This insulating material layer 52 can be formed of a ceramic material such as alumina or zirconia by using the AD method, the sputtering method, the CVD method or the sol-gel method or the like.

Sixth Modified Embodiment

Figure 15:
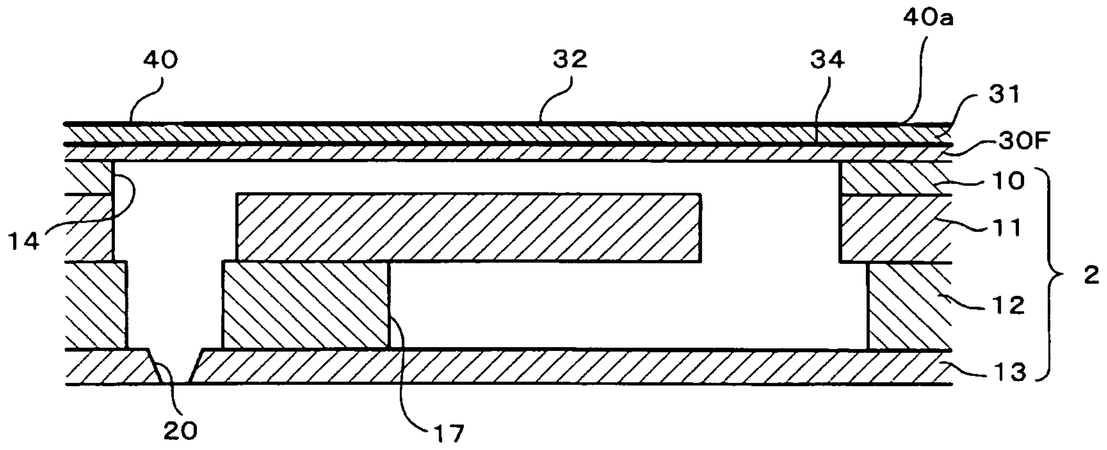
FIG. 15 is a cross-sectional view of a sixth modified embodiment, corresponding to FIG. 4.

Further, in a case that the vibration plate is formed of a silicon material, the upper surface of the vibration plate may be subjected to an oxidation processing so as to be insulative, or an insulating material layer 52 may be formed on the upper surface of the vibration plate, similar to the case in which the vibration plate is formed of a metallic material. Moreover, in a case that the vibration plate is formed of a ceramic material, or an insulating material such as synthetic resin material or the like, the common electrode 34 is formed directly on the upper surface of the vibration plate 30F, as shown in FIG. 15.

Figure 16:
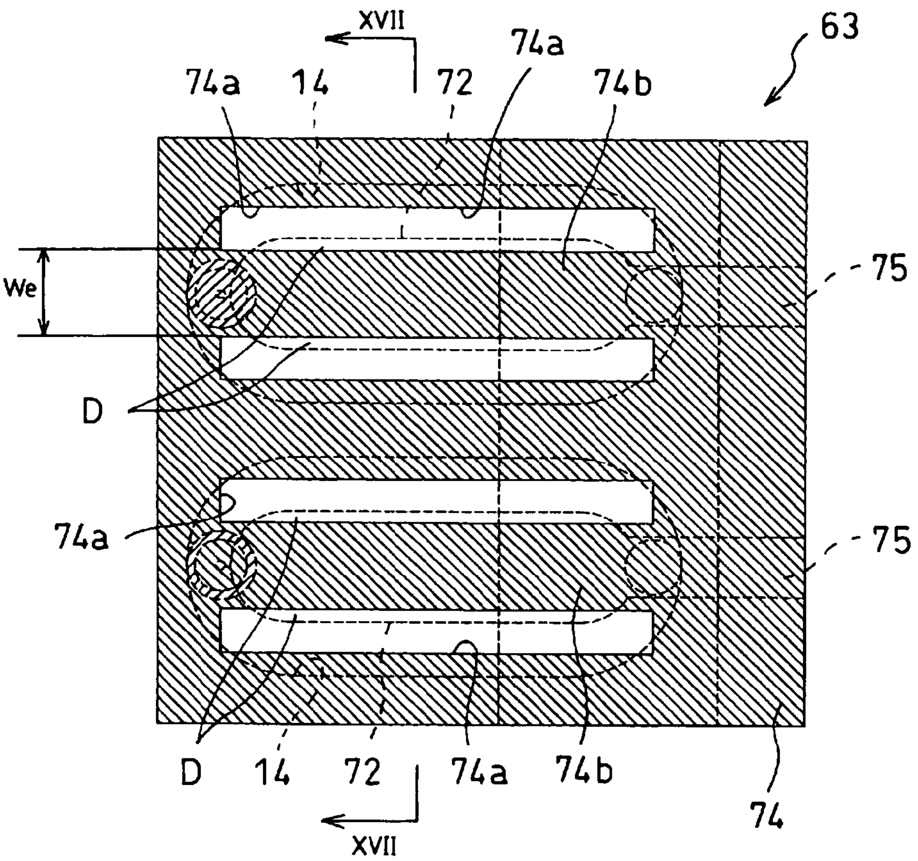
FIG. 16 is a partial magnified plan view of an ink-jet head of a second embodiment.
Figure 17:
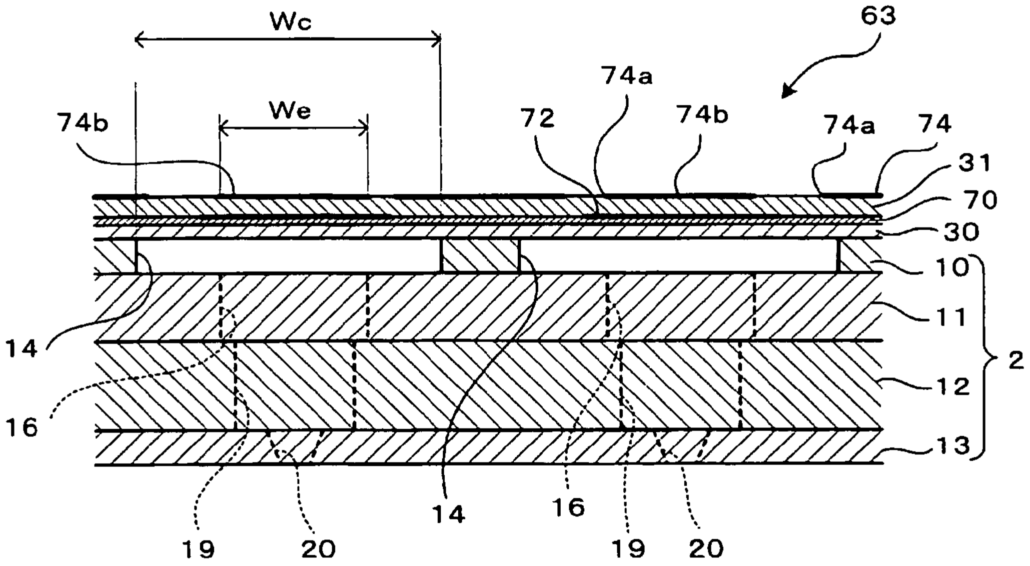
FIG. 17 is a cross-sectional view along line XVII-XVII of FIG. 16.

Next, an explanation will be given about a second embodiment of the present invention. Elements or components having the same configuration as those in the first embodiment are given the same reference numerals and descriptions therefore are omitted as appropriate. As shown in FIG. 16 and FIG. 17, in a piezoelectric actuator 63 of an ink-jet head of the second embodiment is different from the piezoelectric actuator 3 (see FIG. 2 to FIG. 5) of the first embodiment in that a plurality of individual electrodes 72 are arranged at a lower side (side of pressure chamber 14) of the piezoelectric layer 31 and a common electrode 74 is arranged at an upper side (side opposite to the pressure chamber 14) of the piezoelectric layer 31.

As shown in FIG. 17, an insulating material layer 70 is formed on the upper surface of a metallic vibration plate 30. This insulating material layer 70 is formed of an insulative ceramic material such as, for example, alumina or zirconia and can be formed using the AD method, the sputtering method, the CVD method or the sol-gel method or the like. A plurality of individual electrodes 72 having shapes that are smaller to some extent than those of the pressure chambers 14, and wirings 75 extending from the individual electrodes 72 respectively are formed on the upper surface of the insulating material layer 70. The individual electrodes 72 and wirings 75 are mutually insulated by the insulating material layer 70. Further, the wirings 75 are connected to a driver IC, and a drive voltage is selectively applied to the individual electrodes 72 by the driver IC via the wirings 75 respectively.

Further, the piezoelectric layer 31 formed of PZT or the like is formed entirely over the upper surface of the insulating material layer 70 similar to the first embodiment. A common electrode 74 is continuously formed so as to span over the plurality of pressure chambers 14 on the upper surface of the piezoelectric layer 31. The common electrode 74 is grounded to be held at ground potential. However, since the common electrode 74 is continuously formed so as to span across the plurality of pressure chambers 14, it is possible to keep the common electrode 74 at ground potential via a small number of wiring (for example, one wiring), thereby making it possible to simplify the configuration of the piezoelectric actuator 63.

Here, as shown in FIG. 16, two rectangular holes 74*a* extending in a longitudinal direction (left and right direction in FIG. 16) of one of the pressure chambers 14 are formed at an area of the common electrode 74 overlapping in a plane view with one of the pressure chambers 14 so as to overlap with edges of one of the individual electrodes 72 respectively. In the second embodiment, an area which is disposed in one of the holes 74*a* and which faces one of the individual electrodes 72 (area D of FIG. 16: first electrode non-forming area) is adjusted so that the width We of a portion 74*b* of the common electrode 74 becomes a predetermined width according to the amount of deviation of the thickness of the piezoelectric layer 31, the portion 74*a* being disposed between the two holes 74*a* and facing one of the individual electrodes 72; and that the fluctuation in the thickness of the piezoelectric layer 31 is compensated with the electrode width We. The relationship among the thickness Tp of the piezoelectric layer 31, the electrode width We and the maximum amount of displacement Dd of the vibration plate 30 for carrying out this compensation is substantially the same as the relationship of the first embodiment (see FIG. 6).

Figure 18A:
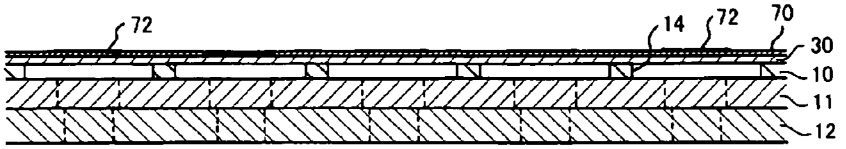
FIG. 18A shows a step for joining metal plates to forming individual electrodes.
Figure 18B:
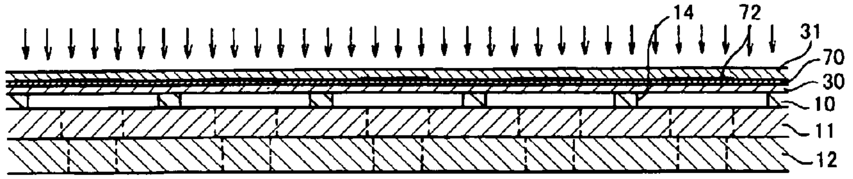
FIG. 18B shows a step for forming a piezoelectric layer.

An explanation is now given about a method for manufacturing the ink-jet head of the second embodiment. First, as shown in FIG. 18A, the four metal plates of the cavity plate 10, the base plate 11, the manifold plate 12 and the vibration plate 30 are joined together. Then, after forming the insulating material layer 70 on the upper surface of the vibration plate 30 using the AD method and the sputtering method or the like, the plurality of individual electrodes 72 and the plurality of wirings 75 are formed on the upper surface of the insulating material layer 70 using the screen printing and the deposition method or the like. Next, as shown in FIG. 18B, the piezoelectric layer 31 is formed by depositing particles of a piezoelectric material on the upper surface of the insulating material layer 70 (side of the vibration plate 30 opposite to the pressure chambers 14) using the AD method, the sputtering method, the CVD method, the sol-gel method, or the hydrothermal synthesis method or the like (piezoelectric layer forming step).

Figure 18C:
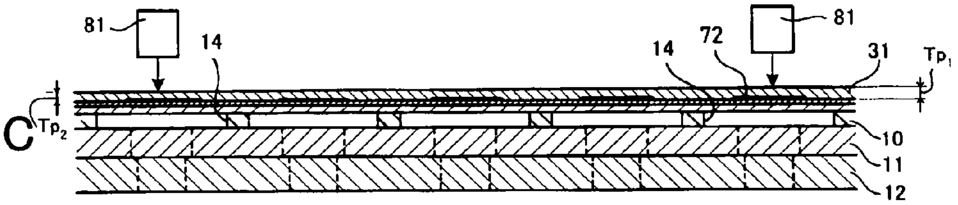
FIG. 18C shows a step for measuring thickness.

Next, as shown in FIG. 18C, a thickness Tp of the piezoelectric layer 31 at areas facing the pressure chambers 14 and the individual electrodes 72 is measured using a laser displacement meter 81 or the like (thickness measuring step). The value of We/Wc is determined such that the maximum amount of displacement Dd of the vibration plate 30 becomes a predetermined target value, the value We/Wc being determined from the measured (or interpolated from the measured value) thickness Tpi of the piezoelectric layer 31, and from the relationship obtained in advance (see FIG. 6 of the first embodiment) among the thickness Tp of the piezoelectric layer 31, the width We of the portion 74*b* of the common electrode 74 which faces one of the individual electrodes 72, and the maximum amount of displacement Dd of the vibration plate 30 when the piezoelectric actuator is driven. Then, the electrode width We is calculated (electrode length determining step).

Figure 18D:
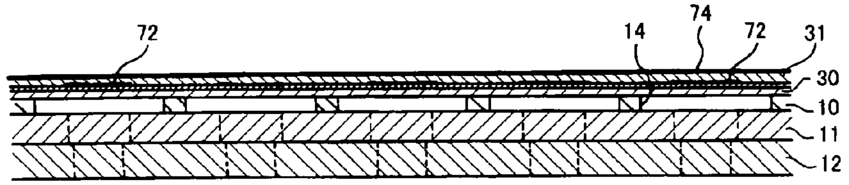
FIG. 18D shows a step for forming a common electrode.
Figure 18E:
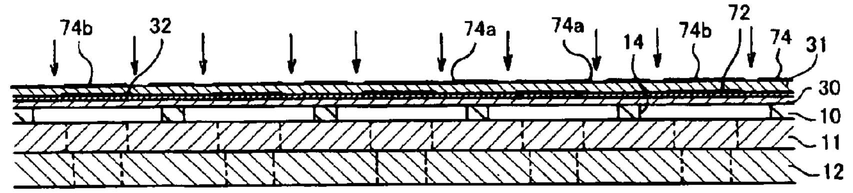
FIG. 18E shows a step for forming holes.

Next, as shown in FIG. 18D, the common electrode 74 is formed entirely over the upper surface of the piezoelectric layer 31 (S14). Then, as shown in FIG. 18E, the two holes 74*a* corresponding to each of the pressure chambers 14 are formed, by partially removing the common electrode 74 using a carbon dioxide gas laser or the like, such that the electrode width We of the portion 74*b* of the common electrode 74, the portion 74*b* being disposed between the two holes 74*a* corresponding to each of the pressure chambers, becomes the value determined in the aforementioned manner (electrode forming step).

Figure 18F:
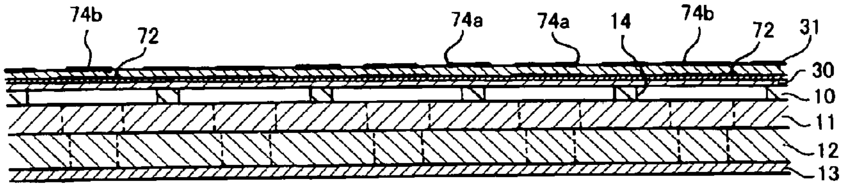
FIG. 18F shows a step for joining a nozzle plate.

Finally, as shown in FIG. 18F, the nozzle plate 13 is joined to the lower surface of the manifold plate 12, and the manufacture of the ink-jet head is completed.

According to the ink-jet head and the manufacturing method of the same of the second embodiment, even in a case in which there is fluctuation in the thickness of the piezoelectric layer 31, the widths We of the portions of the common electrode 74 which face the individual electrode 72 respectively are adjusted according to the amount of deviation of the piezoelectric layer 31 such that the amount of deformation of the vibration plate 30 becomes a predetermined target value so as to compensate for the fluctuation in the thickness of the piezoelectric layer 31. Therefore, the fluctuation in the amount of deformation of the vibration plate 30 due to the fluctuation in the thickness of the piezoelectric layer 31 becomes small, as in the first embodiment.

Next, an explanation will be given about modified embodiments in which various changes are made to the second embodiment.

Seventh Modified Embodiment

Figure 19:
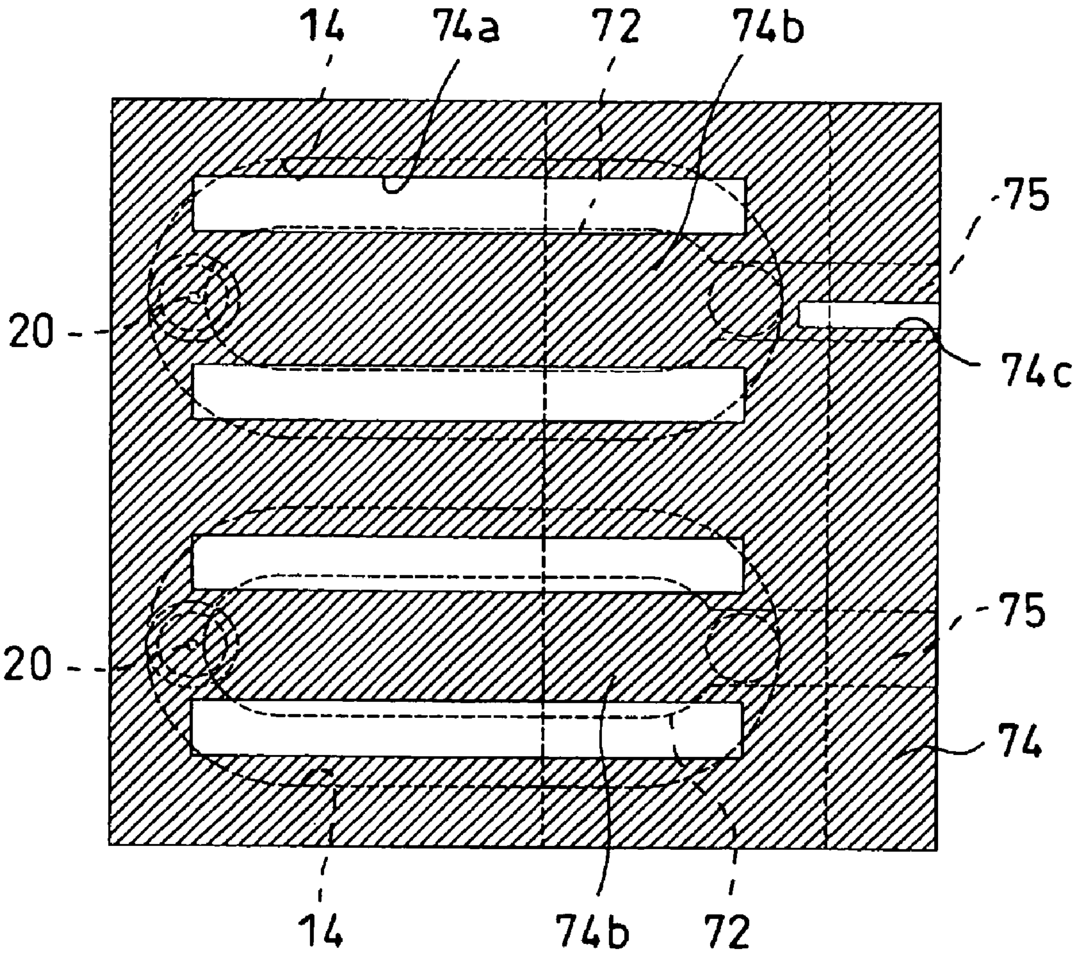
FIG. 19 is a magnified plan view of a modified embodiment of the second embodiment corresponding to FIG. 16.

In a case that widths We of the portions 74*b* of the common electrode 74 facing the individual electrodes 72 respectively are set to be mutually different values in order to compensate for the fluctuation in the thickness of the piezoelectric layer 31, then the surface areas of the portions 74*b* of the common electrode 74 which face the individual electrodes 72 respectively become different regarding the plurality of pressure chambers 14, and the fluctuation in electrostatic capacitance occurs between the pressure chambers 14. In order to suppress this fluctuation in electrostatic capacitance, a hole 74*c* in which the common electrode 74 is not partially formed is provided at an area facing one of the wirings 75. Then, the surface area of this area (second electrode non-forming area) disposed in the hole 74*c* may be adjusted such that the surface areas of the portions of the common electrode 74 facing the individual electrodes 72 and the wirings 75 respectively are all made to be equal in relation to the plurality of pressure chambers 14. For example, in FIG. 19, the width of a portion 74*b* of the common electrode 74 facing an individual electrode 72 on the upper side is larger than the width of a portion 74*b* of the common electrode 74 facing an individual electrode 72 on the lower side. Accordingly, a hole 74*c* is formed at an area facing the wiring 75 associated with the individual electrode 72 on the upper side in order to make the surface area of the portion of the common electrode 74 facing the individual electrode 72 and the wiring 75 on the upper side to be small.

Further, it is possible to adjust the surface areas of the facing portions 74*b* with the surface area of the hole 74*c* such that the electrostatic capacitance between each of the individual electrodes 72 and the common electrode 74 becomes the same for each of the individual electrodes 72 by considering the thickness of the piezoelectric layer 31 between the common electrode 74 and each of the individual electrodes 72 obtained through the measurement or interpolation. With this, it is possible to further suppress the fluctuation in electrostatic capacitance between each of the individual electrodes 72 and the common electrode 74.

In the second embodiment, the common electrode 74 is continuously formed so as to range over the plurality of pressure chambers 14. However, a plurality of common electrodes may be formed to correspond to the plurality of individual electrodes 72 respectively, and the plurality of common electrodes may be grounded respectively to be held at ground potential.

The material for the vibration plate is not limited to metallic materials (conductive materials), and vibration plates formed of various materials such as a vibration plate made of silicon in which an upper surface thereof is subjected to oxidation processing, or a vibration plate formed of a synthetic resin material such as polymide may also be adopted. In a case that the vibration plate is formed of insulating material, the insulating material layer 70, which insulates the plurality of individual electrodes 72 from each other and which is necessary in the case in which the vibrating plate is formed of metal material, is no longer necessary, and the plurality of individual electrodes 72 and the plurality of wirings 75 are formed directly on the upper surface of the insulative vibration plate.

As with the first embodiment, the shapes of the pressure chambers and the individual electrodes are not limited to a shape long in one direction. Further, the individual electrodes are not limited to being arranged at areas overlapping with central portions of the pressure chambers respectively, and may also be arranged at positions overlapping with edges of the pressure chambers respectively (third modified embodiment of the first embodiment: see FIG. 12).

The first embodiment, second embodiment, and the respective modified embodiments described above are examples in which the present invention is applied to a piezoelectric actuator for an ink-jet head which applies pressure to ink, but the present invention may also be applied to a piezoelectric actuator which applies pressure to liquid other than ink. In these embodiments and modified embodiments, the lengths of the individual electrodes are adjusted based on an amount of deviation, from a reference value, of the thickness of the piezoelectric layer. However, based on the graphs in FIG. 6 and FIG. 7, the lengths of the individual electrodes may adjusted from the measured thickness of the piezoelectric layer or interpolated values based on the measured values, without obtaining the amount of deviation.

What is claimed is:

1. A liquid transporting apparatus comprising:

a channel unit which has a plurality of pressure chambers arranged along a plane, and a piezoelectric actuator which is provided on a surface of the channel unit, which selectively changes volumes of the plurality of pressure chambers, the piezoelectric actuator including:

a vibration plate covering the plurality of pressure chambers;

a piezoelectric layer which is arranged on a side of the vibration plate opposite to the pressure chambers and which is polarized in a direction of thickness of the piezoelectric layer;

a conductive layer arranged entirely over the piezoelectric layer on a side opposite to the vibration plate;

a first electrode provided at an area of the piezoelectric layer on a side of the pressure chambers, the area facing the pressure chambers; and second electrodes formed in areas, of the conductive layer, defined by a hole formed in the conductive layer, each of the areas facing one of the pressure chambers;

wherein lengths in a predetermined direction of the second electrodes at portions facing the first electrode differ in positive correlation with thicknesses of the piezoelectric layer at first portions each of which is interposed between the first electrode and one of the second electrodes, the first portions displacing to change the volumes of the pressure chambers; and second portions of the piezoelectric layer each of which is not interposed between the first electrode and one of the second electrodes do not displace to change the volumes of the pressure chambers.

2. The liquid transporting apparatus according to claim 1, wherein the lengths in the predetermined direction of the second electrodes at the portions facing the first electrode are adjusted according to an amount of deviation of thicknesses of the piezoelectric layer from a predetermined reference thickness at the portions interposed between the first electrode and one of the second electrodes.

3. The liquid transporting apparatus according to claim 2, wherein the first electrode is a common electrode formed continuously across the pressure chambers on a surface of the piezoelectric layer on a side of the pressure chambers; and the second electrodes are individual electrodes to which a drive voltage is applied to deform the piezoelectric layer.

4. The liquid transporting apparatus according to claim 3, wherein the vibration plate is formed of a metal material and functions as the common electrode.

5. The liquid transporting apparatus according to claim 3, wherein each of the individual electrodes is arranged at an area facing a central portion of one of the pressure chambers having a shape long in one direction, and has a shape which is long in a longitudinal direction of one of the pressure chambers; and lengths in a short direction of the individual electrodes, parallel with the plane and orthogonal to the longitudinal direction, are lengths determined according to the amount of deviation of the thicknesses of the piezoelectric layer.

6. The liquid transporting apparatus according to claim 3, wherein each of the individual electrodes is arranged at least at an area overlapping with two edges of one of the pressure chambers, the two edges being positioned at both sides of one of the pressure chambers as viewed from a direction orthogonal to the plane with respect to a central line which passes through a center of one of the pressure chambers and which is parallel to the plane; and lengths of the individual electrodes in a direction which is parallel to the plane and orthogonal to the center line are the lengths determined according to the amount of deviation of the thicknesses of the piezoelectric layer.

7. The liquid transporting apparatus according to claim 3, wherein surface areas of the individual electrodes facing the common electrode are all equal in relation to the plurality of pressure chambers.

8. The liquid transporting apparatus according to claim 7, wherein the individual electrodes have extending sections each of which extends up to an area not facing one of the pressure chambers; and surface areas of the extending sections are determined according to the lengths in the predetermined direction of the individual electrodes.

9. The liquid transporting apparatus according to claim 2, wherein the first electrode is individual electrodes to which a drive voltage is applied to deform the piezoelectric layer; and the second electrodes are formed on the side of the piezoelectric layer opposite to the pressure chambers to be a common electrode.

10. The liquid transporting apparatus according to claim 9, wherein the second electrodes are continuously formed to span across the plurality of pressure chambers.

11. The liquid transporting apparatus according to claim 10, wherein a first electrode non-forming area, in which the common electrode is partially absent, is provided at an area of the piezoelectric layer on a side opposite to the vibration plate, the area facing the individual electrodes.

12. The liquid transporting apparatus according to claim 10, wherein wirings are arranged in the piezoelectric layer on the side of the pressure chambers, the wirings being connected to the individual electrodes respectively to supply the drive voltage to the individual electrodes; and a second electrode non-forming area, in which the common electrode is partially absent, is provided at an area of the piezoelectric layer on the side of the piezoelectric layer opposite to the pressure chambers, the area facing the wirings.

13. The liquid transporting apparatus according to claim 12, wherein surface areas of portions of the common electrode facing the individual electrodes and the wirings respectively are all equal in relation to the plurality of pressure chambers.

14. The liquid transporting apparatus according to claim 9, wherein the common electrode has at least one opening at an area facing one of the plurality of pressure chambers.

15. The liquid transporting apparatus according to claim 14, wherein, surface areas of the areas in each of which the at least one opening and one of the individual electrodes overlap in a plane view differ according to the thicknesses of the piezoelectric layer at portions each of which is interposed between one of the individual electrodes and the common electrode.

16. A method for manufacturing a liquid transporting apparatus including a channel unit having a plurality of pressure chambers arranged along a plane, and a piezoelectric actuator which is provided on a surface of the channel unit and which selectively changes volumes of the plurality of pressure chambers, the method comprising:

a piezoelectric layer forming step of forming a piezoelectric layer on a surface of a vibration plate which covers the pressure chambers and which has a first electrode provided on a surface of the vibration plate, the piezoelectric layer being polarized in a direction of thickness of the piezoelectric layer and formed on the surface of the vibration plate provided with the first electrode, the first electrode being provided at an area of the vibration plate which faces the pressure chambers, the area being on a side of the vibration plate opposite to the pressure chambers;

a thickness measuring step of measuring thicknesses of the piezoelectric layer at areas each of which overlaps with one of the pressure chambers and the first electrode in a plane view;

a step of forming a conductive layer entirely over a surface of the piezoelectric layer on a side opposite to the first electrode; and a step of forming second electrodes in areas, of the conductive layer, defined by a hole formed in the conductive layer by adjusting lengths in a predetermined direction of the second electrodes in positive correlation with the measured thicknesses of the piezoelectric layer at first portions each of which is interposed between the first electrode and one of the second electrodes, the first portions displacing to change the volumes of the pressure chambers;

wherein the piezoelectric layer is formed to have second portions each of which is not interposed between the first electrode and one of the second electrodes, and which do not displace to change the volumes of the pressure chambers.

17. The method for manufacturing the liquid transporting apparatus according to claim 16, wherein the step of forming the second electrodes further includes:

an electrode length determining step of determining lengths of portions of the second electrodes in a predetermined direction, the portions facing the first electrode, and the second electrodes facing at least partially the first electrode with the piezoelectric layer being interposed between the first and second electrodes, the lengths being determined according to an amount of deviation of the thicknesses of the piezoelectric layer, measured in the thickness measuring step, from a predetermined reference thickness set in advance; and an electrode forming step for forming the second electrodes on a surface of the piezoelectric layer on a side opposite to the vibration plate such that the lengths in the predetermined direction of the portions facing the first electrode become the lengths determined in the electrode length determining step.

18. The method for manufacturing the liquid transporting apparatus according to claim 16, wherein the step of forming the second electrodes further includes:

an electrode length determining step of determining lengths in the predetermined direction of portions of the second electrodes facing the first electrode, each of the second electrodes facing the first electrode at least partially with the piezoelectric layer being interposed between the first and second electrodes, the lengths being determined according to an amount of deviation of the thicknesses of the piezoelectric layer measured in the thickness measuring step from a predetermined reference thickness set in advance; and an electrode forming step for forming the second electrodes, on the side of the piezoelectric layer opposite to the pressure chambers such that the lengths in the predetermined direction of the portions of the second electrodes facing the first electrode become the lengths determined in the electrode length determining step.

19. The method for manufacturing the liquid transporting apparatus according to claim 18, wherein the piezoelectric layer is formed, in the piezoelectric layer forming step, by an aerosol deposition method, a sputtering method, a chemical vapor deposition method, a sol-gel method, or a hydrothermal synthesis method.

20. The method for manufacturing the liquid transporting apparatus according to claim 18, wherein thickness of portions of the piezoelectric layer respectively facing a part of the pressure chambers of the plurality of pressure chambers are measured in the thickness measuring step; and thicknesses of portions of the piezoelectric layer respectively facing other pressure chambers other than the part of the pressure chambers are calculated by interpolating the measured thicknesses of the portions of the piezoelectric layer respectively facing the part of the pressure chambers.

21. The method for manufacturing the liquid transporting apparatus according to claim 18, wherein in the electrode forming step, the second electrodes are formed such that the lengths in the predetermined direction of the second electrodes become the lengths determined in the electrode length determining step by forming a conductive layer entirely on the side of the piezoelectric layer opposite to the pressure chambers and then partially removing the conductive layer.

22. The method for manufacturing the liquid transporting apparatus according to claim 18, wherein the first electrode is a common electrode formed continuously across the plurality of pressure chambers, on a surface of the vibration plate on a side opposite to the pressure chambers; and the second electrodes are individual electrodes to which a drive voltage for deforming the piezoelectric layer is applied.

23. The method for manufacturing the liquid transporting apparatus according to claim 18, wherein:

the second electrodes formed in the electrode forming step are arranged at areas which face central portions of the pressure chambers having a shape long in one direction, and has a shape long in a longitudinal direction of the pressure chambers, and the lengths in the predetermined direction of the second electrodes, determined in the electrode length determining step, are lengths in a short direction of the portions of the second electrodes facing the first electrode, the sort direction orthogonal to the longitudinal direction;

the method includes, before the electrode length determining step, a target value determining step of determining a design target value of the lengths in the short direction of the second electrodes; and the target value determining step includes: a first step of obtaining a relationship among Tp, We/Wc, and Dd, We/Wc being a ratio of We and Wc, wherein the thickness of the piezoelectric layer is Tp. The length in the short direction of the portions of the second electrodes facing the first electrode is We, the length in the short direction of the pressure chambers is Wc, and an amount of displacement of the portion of the vibration plate facing the center of the pressure chambers is Dd; and a second step of determining a design target value Tp0 for the thickness of the piezoelectric layer which is to be the predetermined reference thickness, a design target value Dd0 for the amount fo displacement Dd, and a design target value We0/Wc0 for We/Wc based on the relationship among Tp, We/Wc, and Dd obtained in the first step; and in the second step, a value for We0/Wc0 is determined in a range We0/Wc0≦0.52, or a range of We0/Wc0≧0.60.

24. The method for manufacturing the liquid transporting apparatus according to claim 23, wherein the value We0/Wc0 is determined in the range of We0/Wc0≦0.52 in the second step.

25. The method for manufacturing the liquid transporting apparatus according to claim 16, wherein in the step of forming the second electrodes, the surface areas of the portions of the second electrodes overlapping with the first electrode in a plane view are adjusted according to an amount of electrostatic capacitance between the first electrode and the portions of the second electrodes overlapping with the first electrode in a plane view.

* * * * *